United States Patent
Shimizu et al.

(10) Patent No.: US 9,091,916 B2
(45) Date of Patent: Jul. 28, 2015

(54) POSITIVE-TYPE PHOTORESIST COMPOSITION, PHOTORESIST LAMINATE, METHOD FOR PRODUCING PHOTORESIST PATTERN, AND METHOD FOR PRODUCING CONNECTING TERMINAL

(71) Applicant: TOKYO OHKA KOGYO CO., LTD., Kanagawa (JP)

(72) Inventors: Takahiro Shimizu, Kanagawa (JP); Yasushi Washio, Kanagawa (JP); Yasushi Kuroiwa, Kanagawa (JP); Takayoshi Mori, Kanagawa (JP); Yoshiyuki Utsumi, Kanagawa (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 135 days.

(21) Appl. No.: 13/774,891

(22) Filed: Feb. 22, 2013

(65) Prior Publication Data
US 2013/0230801 A1    Sep. 5, 2013

(30) Foreign Application Priority Data

Feb. 27, 2012  (JP) ................................ 2012-040525
Jan. 21, 2013  (JP) ................................ 2013-008683

(51) Int. Cl.
*G03F 7/004*   (2006.01)
*G03F 7/20*    (2006.01)
*G03F 7/039*   (2006.01)

(52) U.S. Cl.
CPC ............ *G03F 7/0397* (2013.01); *G03F 7/0042* (2013.01); *G03F 7/0045* (2013.01); *G03F 7/20* (2013.01)

(58) Field of Classification Search
None
See application file for complete search history.

(56) References Cited

U.S. PATENT DOCUMENTS

| | | | |
|---|---|---|---|
| 2009/0068342 A1* | 3/2009 | Senzaki et al. ................. | 427/58 |
| 2010/0047715 A1* | 2/2010 | Washio et al. ............. | 430/286.1 |
| 2013/0029270 A1* | 1/2013 | Hatakeyama ............. | 430/284.1 |

FOREIGN PATENT DOCUMENTS

| | | | |
|---|---|---|---|
| JP | 9176112 | | 7/1997 |
| JP | 11052562 | | 2/1999 |
| JP | 2010152136 A | * | 7/2010 |

OTHER PUBLICATIONS

Machine translation JP 2010-152136. Jul. 8, 2010.*

* cited by examiner

*Primary Examiner* — Anca Eoff
*Assistant Examiner* — Alyssa L Cepluch
(74) *Attorney, Agent, or Firm* — Knobbe Martens Olson & Bear LLP

(57) ABSTRACT

What is provided is a positive-type photoresist composition containing an acid generator (A) capable of generating an acid when irradiated with an active ray or radiation, a resin (B) whose solubility in alkali increases under the action of acid, and an organic solvent (S), the photoresist composition further containing an alkali-metal salt (C).

8 Claims, No Drawings

POSITIVE-TYPE PHOTORESIST COMPOSITION, PHOTORESIST LAMINATE, METHOD FOR PRODUCING PHOTORESIST PATTERN, AND METHOD FOR PRODUCING CONNECTING TERMINAL

This application is based on and claims the benefit of priority from Japanese Patent Application Nos. 2012-040525 and 2013-008683, respectively filed on 27 Feb. 2012 and 21 Jan. 2013, the contents of which are incorporated herein by reference.

BACKGROUND OF THE INVENTION

1. Field of the Invention

The present invention relates to a positive-type photoresist composition, a photoresist laminate using the positive-type photoresist composition, a method for producing a photoresist pattern, and a method for producing a connecting terminal.

2. Related Art

Photofabrication is now the mainstream of a microfabrication technique. Photofabrication is a generic term describing the technology used for manufacturing a wide variety of precision components such as semiconductor packages. The manufacturing is carried out by applying a photoresist composition to the surface of a processing target to form a photoresist layer, patterning this photoresist layer using photolithographic techniques, and then conducting chemical etching, electrolytic etching, and/or electroforming based mainly on electroplating, using the patterned photoresist layer (photoresist pattern) as a mask.

In recent years, high density packaging technologies have progressed in semiconductor packages along with downsizing electronics devices, and the increase in package density has been developed on the basis of mounting multi-pin thin film in packages, miniaturizing of package size, two-dimensional packaging technologies in flip-tip systems or three-dimensional packaging technologies. In these types of high density packaging techniques, connection terminals, including protruding electrodes (mounting terminals) known as bumps that protrude above the package or metal posts that extend from peripheral terminals on the wafer and connect rewiring with the mounting terminals, are disposed on the surface of the substrate with high precision.

In the photofabrication as described above, a photoresist composition is used, and chemically amplified photoresist compositions containing an acid generator have been known as such a photoresist composition, (see Patent Documents 1, 2 and the like). According to the chemically amplified photoresist composition, an acid is generated from the acid generator upon irradiation with radiation (exposure) and diffusion of the acid is promoted through heat treatment, to cause an acid catalytic reaction with a base resin and the like in the composition resulting in a change to the alkali-solubility of the same.

Such a chemically amplified positive-type photoresist composition is used for forming, for example, bumps or metal posts through plating processes. Specifically, a photoresist layer having a desired film thickness is formed on a support by using a chemically amplified photoresist composition, and the photoresist layer is exposed through a predetermined mask pattern and is developed. Thereby, a photoresist pattern in which portions for forming bumps or metal posts have been selectively removed (stripped) is formed. Then, bumps or metal posts can be formed by embedding a conductor such as copper into the removed portions (resist-free portions) using plating, and then removing the surrounding residual resist pattern.

Patent Document 1: Japanese Unexamined Patent Application, Publication No. H9-176112
Patent Document 2: Japanese Unexamined Patent Application, Publication No. H11-52562

SUMMARY OF THE INVENTION

In regard to the formation of connecting terminals such as bumps or metal posts through plating processes as described above, it is desirable that in a nonresist section of a photoresist pattern, the width of the bottom (the support surface side) be larger than the width of the top (the surface side of the photoresist layer). The contact area between the bottom surfaces of the connecting terminals such as bumps or metal posts and the support is thereby increased, and the adhesiveness between the connecting terminals and the support is thereby improved.

However, when a photoresist pattern for forming connecting terminals such as bumps or metal posts is formed by using the conventionally known chemically amplified positive-type photoresist compositions that are disclosed in Patent Documents 1 and 2 and the like, it is difficult to form a photoresist pattern having a nonresist section in which the width of the bottom is larger than the width of the top.

The present invention was made in view of the problems described above, and it is an object of the present invention to provide a positive-type photoresist composition capable of forming, in the case of forming a photoresist pattern for forming connecting terminals such as bumps or metal posts by using a positive-type photoresist composition, a photoresist pattern having a nonresist section in which the width of the bottom (the support surface side) is larger than the width of the top (the surface side of the photoresist layer); a photoresist laminate using such a composition; a method for producing a photoresist pattern; and a method for producing a connecting terminal.

The inventors of the present invention conducted a thorough investigation in order to achieve the object, and as a result, the inventors found that the problems described above can be solved by incorporating a particular alkali-metal salt into a positive-type photoresist composition, thus realizing the present invention. Specifically, the present invention provides the following.

A first aspect of the present invention provides a positive-type photoresist composition containing an acid generator (A) capable of generating an acid when irradiated with an active ray or radiation, a resin (B) whose solubility in alkali increases under the action of acid, an alkali-metal salt (C), and an organic solvent (S), in which composition the alkali-metal salt (C) is represented by the following formula (C1):

$$(W^+)_n X^{n-} \qquad (C1)$$

(where in formula (C1) $W^+$ represents an alkali-metal ion; $X^{n-}$ represents a monovalent or polyvalent counteranion; and n represents an integer of 1 or greater).

A second aspect of the present invention provides a photoresist laminate having laminated therein a support and a photoresist layer formed from the positive-type photoresist composition according to the first aspect.

A third aspect of the present invention provides a method for producing a photoresist pattern, the method including:
a laminating step of laminating, on a support, a photoresist layer formed from the positive-type photoresist composition according to the first aspect;

an exposure step of irradiating the photoresist layer with an active ray or radiation; and a developing step of developing the photoresist layer obtained after the exposure, and thereby obtaining a photoresist pattern.

A fourth aspect of the present invention provides a method for producing a connecting terminal, the method including a step of forming a connecting terminal formed of a conductor in a nonresist section of the photoresist pattern obtainable by the method for producing a photoresist pattern according to the third aspect.

According to the present invention, a positive-type photoresist composition capable of forming, in the case of forming a photoresist pattern for forming connecting terminals such as bumps or metal posts by using a positive-type photoresist composition, a photoresist pattern having a nonresist section in which the width of the bottom (the support surface side) is larger than the width of the top (the surface side of the photoresist layer); a photoresist laminate using such a composition; a method for producing a photoresist pattern; and a method for producing a connecting terminal, can be provided.

DETAILED DESCRIPTION OF THE INVENTION

Positive-Type Photoresist Composition

The positive-type photoresist composition (hereinafter, simply referred to as "photoresist composition") according to the present invention contains at least an acid generator (A) capable of producing an acid when irradiated with an active ray or radiation, a resin (B) whose solubility in alkali increases under the action of acid, an alkali-metal salt (C), and an organic solvent (S).

There are no particular limitations on the applications of the photoresist composition, and the photoresist composition of the present invention is utilized in a variety of applications in which photoresist compositions have been traditionally applied. Suitable examples of applications of the photoresist composition of the present invention include the formation of connecting terminals such as bumps or metal posts in the production of circuit boards and electronic components such as CSPs (chip-size packages) that are mounted on circuit boards, and the formation of a wiring pattern and the like. Hereinafter, the various components that are included in the photoresist composition according to the present invention will be described in detail.

Acid Generator (A)

The acid generator (A) is a compound capable of producing an acid when irradiated with an active ray or radiation, and is not particularly limited as long as it is a compound which directly or indirectly produces an acid under the action of light. When photoresist layers are formed by applying a photoresist composition on various supports, there are no particular limitations on the film thickness of the photoresist layer. However, when the shapes of various terminals that are formed by using the photoresist composition are considered, the film thickness of the photoresist layer is preferably 10 μm to 150 μm, more preferably 20 μm to 120 μm, and particularly preferably 20 μm to 80 μm. When a photoresist layer having such a film thickness is formed by using a photoresist composition, the acid generator (A) is preferably any one of the acid generators of the first to fifth aspects that will be described below. Hereinafter, suitable examples among the acid generators (A) that are suitably used in photoresist compositions will be described as the first to fifth aspects.

The first aspect of the acid generator (A) may be a compound represented by the following general formula (a1):

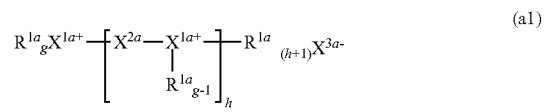

where in general formula (a1) $X^{1a}$ represents a sulfur atom having a valence of g or an iodine atom; g represents 1 or 2; h represents the number of repeating units in the structure within parentheses; $R^{1a}$ represents an organic group that is bonded to $X^{1a}$, and represents an aryl group having 6 to 30 carbon atoms, a heterocyclic group having 4 to 30 carbon atoms, an alkyl group having 1 to 30 carbon atoms, an alkenyl group having 2 to 30 carbon atoms, or an alkynyl group having 2 to 30 carbon atoms; $R^{1a}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen atoms. The number of $R^{1a}$s is g+h (g−1)+1, and the $R^{1a}$s may be respectively identical to or different from each other. Furthermore, two or more $R^{1a}$'s may be bonded to each other directly or via —O—, —S—, —SO—, —SO$_2$—, —NH—, —NR$^{2a}$—, —CO—, —COO—, —CONH—, an alkylene group having 1 to 3 carbon atoms, or a phenylene group, and may form a ring structure containing $X^{1a}$. $R^{2a}$ represents an alkyl group having 1 to 5 carbon atoms, or an aryl group having 6 to 10 carbon atoms.

$X^{2a}$ represents a structure represented by the following general formula (a2):

$$—X^{4a}+X^{5a}—X^{4a}\overline{]_h}$$  (a2)

where in general formula (a2) $X^{4a}$ represents an alkylene group having 1 to 8 carbon atoms, an arylene group having 6 to 20 carbon atoms, or a divalent group of a heterocyclic compound having 8 to 20 carbon atoms; $X^{4a}$ may be substituted with at least one selected from the group consisting of an alkyl group having 1 to 8 carbon atoms, an alkoxy group having 1 to 8 carbon atoms, an aryl group having 6 to 10 carbon atoms, a hydroxyl group, a cyano group, a nitro group, and halogen atoms. $X^{5a}$ represents —O—, —S—, —SO—, —SO$_2$—, —NH—, —NR$^{2a}$—, —CO—, —COO—, —CONH—, an alkylene group having 1 to 3 carbon atoms, or a phenylene group. h represents the number of repeating units of the structure in parentheses. $X^{4a}$'s in the number of h+1 and $X^{5a}$'s in the number of h may be identical to or different from each other. $R^{2a}$ has the same definition as described above.

$X^{3a-}$ represents a counterion of an onium, and examples thereof include a fluorinated alkylfluorophosphoric acid anion represented by the following formula (a17) or a borate anion represented by the following general formula (a18):

$$[(R^{3a})_j PF_{6-j}]^-$$  (a17)

where in general formula (a17) $R^{3a}$ represents an alkyl group having 80% or more of the hydrogen atoms substituted by fluorine atoms. j represents the number of $R^{3a}$s and is an integer from 1 to 5. $R^{3a}$s in the number of j may be respectively identical to or different from each other.

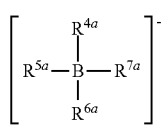

(a18)

where in general formula (a18) $R^{4a}$ to $R^{7a}$ each independently represents a fluorine atom or a phenyl group, and a part or all of the hydrogen atoms of the phenyl group may be substituted by at least one selected from the group consisting of a fluorine atom and a trifluoromethyl group.

Examples of the onium ion in the compound represented by general formula (a1) include triphenylsulfonium, tri-p-tolylsulfonium, 4-(phenylthio)phenyldiphenylsulfonium, bis[4-(diphenylsulfonio)phenyl]sulfide, bis[4-{bis[4-(2-hydroxyethoxy)phenyl]sulfonio]phenyl}sulfide, bis{4-[bis(4-fluorophenyl)sulfonio]phenyl}sulfide, 4-(4-benzoyl-2-chlorophenylthio)phenylbis(4-fluorophenyl)sulfonium, 7-isopropyl-9-oxo-10-thia-9,10-dihydroanthran-2-yldi-p-tolylsulfonium, 7-isopropyl-9-oxo-10-thia-9,10-dihydroanthracen-2-yldiphenylsulfonium, 2-[(diphenyl)sulfonio]thioxanthone, 4-[4-(4-tert-butylbenzoyl)phenylthio]phenyldi-p-tolylsulfonium, 4-(4-benzoylphenylthio)phenyldiphenylsulfonium, diphenylphenacylsulfonium, 4-hydroxyphenylmethylbenzylsulfo-nium, 2-naphthylmethyl(1-ethoxycarbonyl)ethylsulfonium, 4-hydroxyphenylmethylphenacylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, and 4-isobutylphenyl(p-tolyl)iodonium.

Among the onium ions in the compound represented by general formula (a1), a preferred onium ion may be a sulfonium ion represented by the following formula (a19):

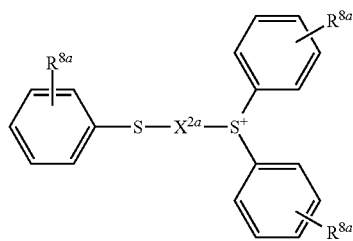

(a19)

where in general formula (a19), $R^{8a}$s each independently represents a hydrogen atom or a group selected from the group consisting of alkyl, hydroxyl, alkoxy, alkylcarbonyl, alkylcarbonyloxy, alkyloxycarbonyl, a halogen atom, an aryl, which may be substituted, and arylcarbonyl. $X^{2a}$ has the same definition as $X^{2a}$ in general formula (a1).

Specific examples of the sulfonium ion represented by general formula (a19) include 4-(phenylthio)phenyldiphenylsulfonium, 4-(4-benzoyl-2-chlorophenylthio)phenylbis(4-fluorophenyl)sulfonium, 4-(4-benzoylphenylthio)phenyldiphenylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, and diphenyl[4-(p-terphenylthio)phenyl]diphenylsulfonium.

In regard to the fluorinated alkylfluorophosphoric acid anion represented by general formula (a17), $R^{3a}$ represents an alkyl group substituted with a fluorine atom, and a preferred carbon number is 1 to 8, while a more preferred carbon number is 1 to 4. Specific examples of the alkyl group include linear alkyl groups such as methyl, ethyl, propyl, butyl, pentyl and octyl; branched alkyl groups such as isopropyl, isobutyl, sec-butyl and tert-butyl; and cycloalkyl groups such as cyclopropyl, cyclobutyl, cyclopentyl, and cyclohexyl. The proportion of hydrogen atoms substituted by fluorine atoms in the alkyl groups is usually 80% or more, preferably 90% or more, and even more preferably 100%. If the substitution ratio of fluorine atoms is less than 80%, the acid strength of the onium fluorinated alkylfluorophosphate represented by general formula (a1) decreases.

A particularly preferred example of $R^{3a}$ is a linear or branched perfluoroalkyl group having 1 to 4 carbon atoms and a substitution ratio of fluorine atoms of 100%. Specific examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. The number of $R^{3a}$s, j, represents an integer from 1 to 5, and is preferably 2 to 4, and particularly preferably 2 or 3.

Preferred specific examples of the fluorinated alkylfluorophosphoric acid anion include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2CF_2)_2PF_4]^-$, and $[(CF_3CF_2CF_2)_3PF_3]^-$. Among these, $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$, and $[((CF_3)_2CFCF_2)_2PF_4]^-$ are particularly preferred.

Preferred specific examples of the borate anion represented by general formula (a18) include tetrakis(pentafluorophenyl)borate $([B(C_6F_5)_4]^-)$, tetrakis[(trifluoromethyl)phenyl]borate $([B(C_6H_4CF_3)_4]^-)$, difluorobis(pentafluorophenyl)borate $([(C_6F_5)_2BF_2]^-)$, trifluoro(pentafluorophenyl)borate $([(C_6F_5)BF_3]^-)$, and tetrakis(difluorophenyl)borate $([B(C_6H_3F_2)_4]^-)$. Among these, tetrakis(pentafluorophenyl)borate $([B(C_6F_5)_4]^-)$ is particularly preferred.

The second aspect of the acid generator (A) include halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4, 6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine and tris(2,3-dibromopropyl)-1,3,5-triazine, and halogen-containing triazine compounds represented by the following general formula (a3) such as tris(2,3-dibromopropyl)isocyanurate.

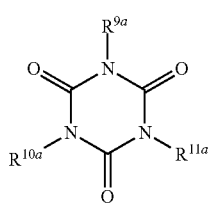

(a3)

In the above general formula (a3), $R^{9a}$, $R^{10a}$ and $R^{11a}$ each independently represent a halogenated alkyl group.

Further, the third aspect of acid generator (A) include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile and α-(ethylsulfonyloxyimino)-1-cyclopentenylacetonitrile, and compounds represented by the following general formula (a4) having an oximesulfonate group.

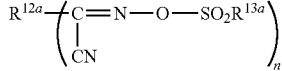

(a4)

In the above general formula (a4), $R^{12a}$ represents a monovalent, bivalent or trivalent organic group; $R^{13a}$ represents a substituted or unsubstituted saturated hydrocarbon group, an unsaturated hydrocarbon group, or an aromatic compound group; and n represents the number of repeating units of the structure in the parentheses.

In the above general formula (a4), the aromatic compound group indicates a group of compounds having physical and chemical properties characteristic of aromatic compounds, and examples thereof include aryl groups such as a phenyl group and a naphthyl group, and heteroaryl groups such as a furyl group and a thienyl group may be exemplified. These may have one or more appropriate substituents such as halogen atoms, alkyl groups, alkoxy groups and nitro groups on the rings. It is particularly preferable that $R^{13a}$ is an alkyl group having 1 to 6 carbon atoms such as a methyl group, an ethyl group, a propyl group, and a butyl group. In particular, compounds in which $R^{12a}$ represents an aromatic compound group, and $R^{13a}$ represents an alkyl group having 1 to 4 carbon atoms are preferred.

Examples of the acid generator represented by the above general formula (a4), include compounds in which $R^{12a}$ is any one of a phenyl group, a methylphenyl group and a methoxyphenyl group, and $R^{13a}$ is a methyl group, provided that n is 1, and specific examples thereof include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, [2-(propylsulfonyloxyimino)-2,3-dihydroxythiophene-3-ylidene](o-tolyl)acetonitrile and the like. Provided that n is 2, the acid generator represented by the above general formula (a4) is specifically an acid generator represented by the following formulae.

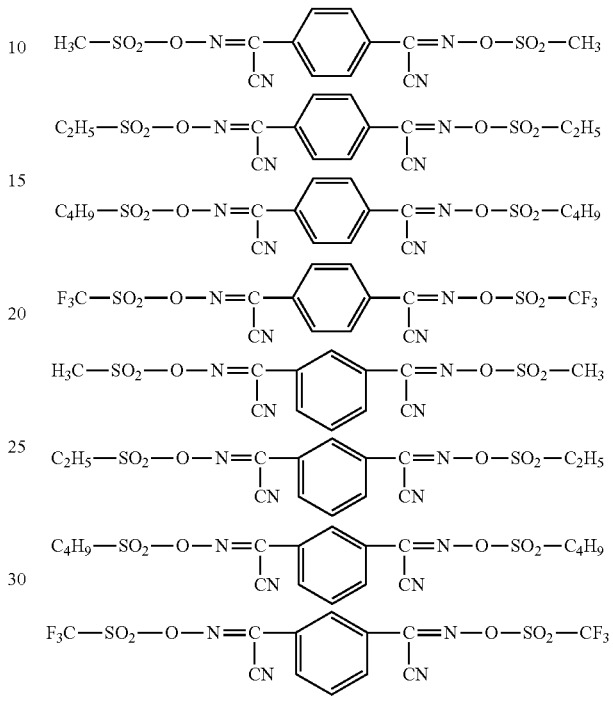

In addition, the fourth aspect of the acid generator (A) include onium salts that have a naphthalene ring at their cation moiety. The expression "have a naphthalene ring" indicates having a structure derived from naphthalene and also indicates at least two ring structures and their aromatic properties are maintained. The naphthalene ring may have a substituent such as a linear or branched alkyl group having 1 to 6 carbon atoms, a hydroxyl group, a linear or branched alkoxy group having 1 to 6 carbon atoms or the like. The structure derived from the naphthalene ring, which may be of a monovalent group (one free valance) or of a bivalent group (two free valences), is desirably of a monovalent group (in this regard, the number of free valance is counted except for the portions connecting with the substituents described above). The number of naphthalene rings is preferably 1 to 3.

Preferably, the cation moiety of the onium salt having a naphthalene ring at the cation moiety is of the structure represented by the following general formula (a5).

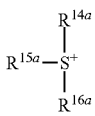

(a5)

In the above general formula (a5), at least one of $R^{14a}$, $R^{15a}$ and $R^{16a}$ represents a group represented by the following general formula (a6), and the remaining represents a linear or branched alkyl group having 1 to 6 carbon atoms, a phenyl group which may have a substituent, a hydroxyl group, or a linear or branched alkoxy group having 1 to 6 carbon atoms. Alternatively, one of $R^{14a}$, $R^{15a}$ and $R^{16a}$ is a group represented by the following general formula (a6), and the remaining two are each independently a linear or branched alkylene group having 1 to 6 carbon atoms, and these terminals may bond to form a ring structure.

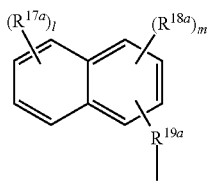

(a6)

In the above general formula (a6), $R^{17a}$ and $R^{18a}$ each independently represent a hydroxyl group, a linear or branched alkoxy group having 1 to 6 carbon atoms, or a linear or branched alkyl group having 1 to 6 carbon atoms; and $R^{19a}$ represents a single bond or a linear or branched alkylene group having 1 to 6 carbon atoms that may have a substituent. l and m each independently represent an integer of 0 to 2, and l+m is no greater than 3. In this regard, when there exists a plurality of $R^{17a}$, they may be identical or different from each other. Furthermore, when there exist a plurality of $R^{18a}$, they may be identical or different from each other.

Preferably, among $R^{14a}$, $R^{15a}$ and $R^{16a}$ as above, the number of groups represented by the above general formula (a6) is one in view of the stability of the compound, and the remaining are linear or branched alkylene groups having 1 to 6 carbon atoms of which the terminals may bond to form a ring. In this case, the two alkylene groups described above form a 3 to 9 membered ring including sulfur atom(s). Preferably, the number of atoms to form the ring (including sulfur atom(s)) is 5 or 6.

The substituent, which the alkylene group may have, is exemplified by an oxygen atom (in this case, a carbonyl group is formed together with a carbon atom that constitutes the alkylene group), a hydroxyl group or the like.

Alternatively, the substituent, which the phenyl group may have, is exemplified by a hydroxyl group, a linear or branched alkoxy groups having 1 to 6 carbon atoms, linear or branched alkyl groups having 1 to 6 carbon atoms, or the like.

Examples of suitable cation moiety include those represented by the following formulae (a7) and (a8), and the structure represented by the following formula (a8) is particularly preferable.

(a7)

(a8)

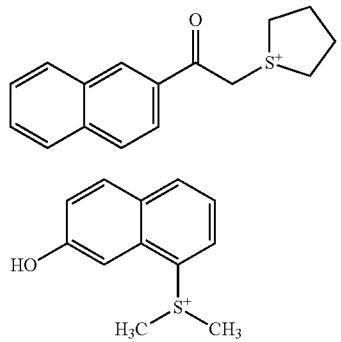

The cation moieties, which may be of an iodonium salt or a sulfonium salt, are desirably of a sulfonium salt in view of acid-producing efficiency.

It is, therefore, desirable that the preferable anion moiety of the onium salt having a naphthalene ring at the cation moiety is an anion capable of forming a sulfonium salt.

The anion moiety of the acid generator is exemplified by fluoroalkylsulfonic acid ions, of which hydrogen atom(s) being partially or entirely fluorinated, or aryl sulfonic acid ions.

The alkyl group of the fluoroalkylsulfonic acid ions may be linear, branched or cyclic and have 1 to 20 carbon atoms. Preferably, the carbon number is 1 to 10 in view of bulkiness and diffusion distance of the produced acid. In particular, branched or cyclic groups are preferable due to shorter diffusion length. Also, methyl, ethyl, propyl, butyl, octyl groups and the like are preferable due to being inexpensively synthesizable.

The aryl group of the aryl sulfonic acid ions may be an aryl group having 6 to 20 carbon atoms, and is exemplified by a phenol group or a naphthyl group that may be unsubstituted or substituted with an alkyl group or a halogen atom. In particular, aryl groups having 6 to 10 carbon atoms are preferred since they can be synthesized inexpensively. Specific examples of preferable aryl group include phenyl, toluenesulfonyl, ethylphenyl, naphthyl, methylnaphthyl groups and the like.

When hydrogen atoms in the fluoroalkylsulfonic acid ion or the aryl sulfonic acid ion are partially or entirely substituted with a fluorine atom, the fluorination rate is preferably 10% to 100%, and more preferably 50% to 100%; it is particularly preferable that all hydrogen atoms are each substituted with a fluorine atom in view of higher acid strength. Specific examples thereof include trifluoromethane sulfonate, perfluorobutane sulfonate, perfluorooctane sulfonate, perfluorobenzene sulfonate, and the like.

Among these, the preferable anion moiety is exemplified by those represented by the following general formula (a9).

$$R^{20a}SO_3^-  \quad (a9)$$

In the above general formula (a9), $R^{20a}$ represents a group represented by the following general formula (a10) or (a11), or a group represented by the following formula (a12).

—$C_xF_{2x+1}$ (a10)

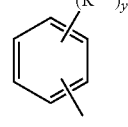

(a11)

(a12)

In the above general formula (a10), x represents an integer of 1 to 4. Also, in the above general formula (a11), $R^{21a}$ represents a hydrogen atom, a hydroxyl group, a linear or branched alkyl group having 1 to 6 carbon atoms, or a linear or branched alkoxy group having 1 to 6 carbon atoms; and y represents an integer of 1 to 3. Of these, trifluoromethane sulfonate, and perfluorobutane sulfonate are preferable in view of safety.

In addition, a nitrogen-containing moiety represented by the following general formula (a13) or (a14) may be also be used for the anion moiety.

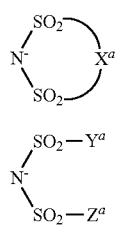

(a13)

(a14)

In the above general formulae (a13) and (a14), $X^a$ represents a linear or branched alkylene group of which at least one hydrogen atom is substituted with a fluorine atom, the carbon number of the alkylene group is 2 to 6, preferably 3 to 5, and most preferably the carbon number is 3. In addition, $Y^a$, $Z^a$ each independently represent a linear or branched alkyl group of which at least one hydrogen atom is substituted with a fluorine atom, the carbon number of the alkyl group is 1 to 10, preferably 1 to 7, and more preferably 1 to 3.

The smaller number of carbon atoms in the alkylene group of $X^a$, or in the alkyl group of $Y^a$ or $Z^a$ is preferred since the solubility into organic solvent is favorable.

In addition, a larger number of hydrogen atoms each substituted by a fluorine atom in the alkylene group of $X^a$, or in the alkyl group of $Y^a$ or $Z^a$ is preferred since the acid strength becomes greater. The percentage of fluorine atoms in the alkylene group or alkyl group, i.e., the fluorination rate is preferably 70 to 100% and more preferably 90 to 100%, and most preferable are perfluoroalkylene or perfluoroalkyl groups in which all of the hydrogen atoms are each substituted with a fluorine atom.

Preferable onium salts having a naphthalene ring at their cation moieties are exemplified by compounds represented by the following formulae (a15) and (a16).

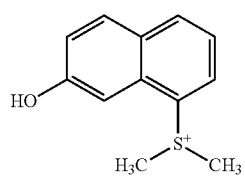

(a15)

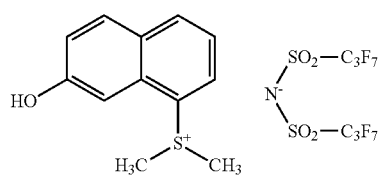

(a16)

Also, the fifth aspect of acid generator (A) include bissulfonyldiazomethanes such as bis(p-toluenesulfonyl)diazomethane, bis(1,1-dimethyl ethylsulfonyl)diazomethane, bis(cyclohexylsulfonyl)diazomethane and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate and dinitrobenzyl carbonate; sulfonates such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide and N-methylsulfonyloxyphthalimide; trifluoromethane sulfonates such as N-hydroxyphthalimide and N-hydroxynaphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate and (p-tert-butylphenyl)diphenylsulfonium trifluoromethanesulfonate; benzointosylates such as benzointosylate and α-methylbenzointosylate; other diphenyliodonium salts, triphenylsulfonium salts, phenyldiazonium salts, benzylcarbonates and the like.

This acid generator (A) may be used alone, or two or more kinds may be used in combination. Furthermore, the content of the acid generator (A) is preferably adjusted to 0.1% to 10% by mass, and more preferably 0.5% to 3% by mass, relative to the total mass of the photoresist composition according to the present invention. When the amount of the acid generator (A) used is adjusted to the range described above, a photoresist composition that is a uniform solution having satisfactory sensitivity and exhibiting excellent storage stability can be readily prepared.

Resin (B)

The resin (B) whose alkali solubility increases by the action of an acid is not particularly limited, and an arbitrary resin whose alkali solubility increases by the action of an acid may be used. Of these, at least one resin selected from the group consisting of novolak resins (B1), polyhydroxystyrene resins (B2) and acrylic resins (B3) is preferably contained.

Novolak Resin (B1)

As the novolak resin (B1), a resin including the structural unit represented by the following general formula (b1) may be used.

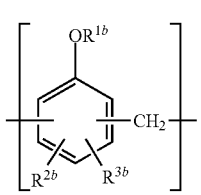

(b1)

In the above general formula (b1), $R^{1b}$ represents an acid-dissociative dissolution-controlling group; $R^{2b}$ and $R^{3b}$ each independently represent a hydrogen atom or an alkyl group having 1 to 6 carbon atoms.

The acid-dissociative dissolution-controlling group represented by the above $R^{1b}$ is preferably a group represented by the following general formula (b2) or (b3), a linear, branched or cyclic alkyl group having 1 to 6 carbon atoms, a vinyloxyethyl group, a tetrahydropyranyl group, a tetrafuranyl group, or a trialkylsilyl group.

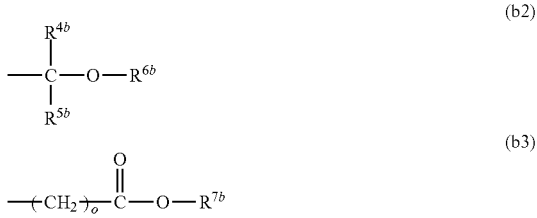

(b2)

(b3)

In the above general formulae (b2) and (b3), $R^{4b}$ and $R^{5b}$ each independently represent a hydrogen atom, or a linear or branched alkyl group having 1 to 6 carbon atoms; $R^{6b}$ represents a linear, branched or cyclic alkyl group having 1 to 10 carbon atoms; $R^{7b}$ represents a linear, branched or cyclic alkyl group having 1 to 6 carbon atoms; and o represents 0 or 1.

Examples of the linear or branched alkyl group include a methyl group, an ethyl group, a propyl group, an isopropyl group, a n-butyl group, an isobutyl group, a tert-butyl group, a pentyl group, an isopentyl group, a neopentyl group, and the like. Also, examples of the cyclic alkyl group include a cyclopentyl group, a cyclohexyl group, and the like.

Specific examples of the acid-dissociative dissolution-controlling group represented by the above general formula (b2) include a methoxyethyl group, ethoxyethyl group, n-propoxyethyl group, isopropoxyethyl group, n-butoxyethyl group, isobutoxyethyl group, tert-butoxyethyl group, cyclohexyloxyethyl group, methoxypropyl group, ethoxypropyl group, 1-methoxy-1-methyl-ethyl group, 1-ethoxy-1-methylethyl group, and the like. Furthermore, specific examples of the acid-dissociative dissolution-controlling group represented by the above general formula (b3) include a tert-butoxycarbonyl group, tert-butoxycarbonylmethyl group, and the like. Examples of the trialkylsilyl group include a trimethylsilyl group and tri-tert-butyldimethylsilyl group in which each alkyl group has 1 to 6 carbon atoms.

Polyhydroxystyrene Resin (B2)

As the polyhydroxystyrene resin (B2), a resin including the structural unit represented by the following general formula (b4) may be used.

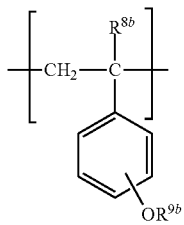

(b4)

In the above general formula (b4), $R^{8b}$ represents a hydrogen atom or an alkyl group having 1 to 6 carbon atoms; and $R^{9b}$ represents an acid-dissociative dissolution-controlling group.

The alkyl group having 1 to 6 carbon atoms may include, for example, linear, branched or cyclic alkyl groups having 1 to 6 carbon atoms. Examples of the linear or branched alkyl group include a methyl group, ethyl group, propyl group, isopropyl group, n-butyl group, isobutyl group, tert-butyl group, pentyl group, isopentyl group and neopentyl group; and examples of the cyclic alkyl group include a cyclopentyl group and cyclohexyl group.

The acid-dissociative dissolution-controlling group represented by the above $R^{9b}$ may be similar to the acid-dissociative dissolution-controlling groups exemplified in terms of the above general formulae (b2) and (b3).

Furthermore, the polyhydroxystyrene resin (B2) may include another polymerizable compound as a structural unit in order to moderately control physical or chemical properties. The polymerizable compound is exemplified by conventional radical polymerizable compounds and anion polymerizable compounds. Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid 2-methacryloyloxyethyl phthalic acid and 2-methacryloyloxyethyl hexahydrophthalic acid; (meth)acrylic acid alkyl esters such as methyl(meth) acrylate, ethyl(meth)acrylate and butyl(meth)acrylate; (meth)acrylic acid hydroxyalkyl esters such as 2-hydroxyethyl(meth)acrylate and 2-hydroxypropyl(meth)acrylate; (meth)acrylic acid aryl esters such as phenyl(meth)acrylate and benzyl(meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

Acrylic Resin (B3)

As the acrylic resin (B3), a resin including a structural unit represented by the following general formulae (b5) to (b7) may be used.

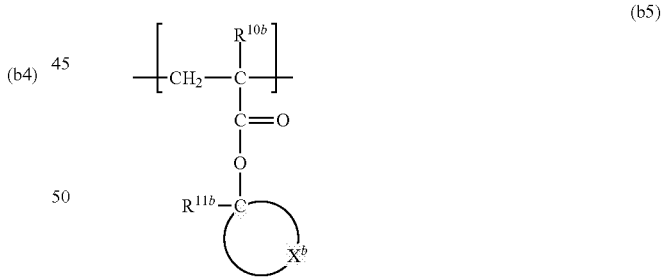

(b5)

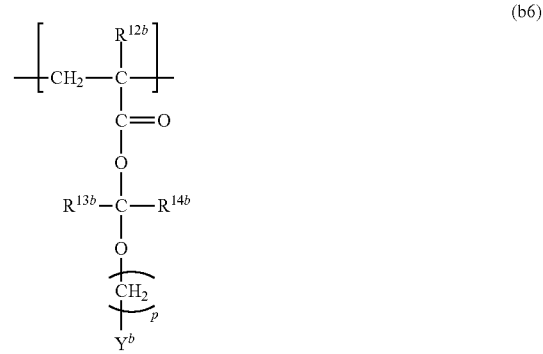

(b6)

-continued

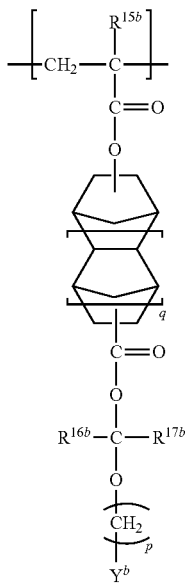

(b7)

In the above general formulae (b5) to (b7), $R^{10b}$ to $R^{17b}$ each independently represent a hydrogen atom, a linear or branched alkyl group having 1 to 6 carbon atoms, a fluorine atom, or a linear or branched fluorinated alkyl group having 1 to 6 carbon atoms (in which, $R^{11b}$ not a hydrogen atom); $X^b$ and the neighboring carbon atoms form a hydrocarbon ring having 5 to 20 carbon atoms; $Y^b$ represents an alicyclic group or alkyl group that may have a substituent; p represents an integer of 0 to 4; and q represents 0 or 1.

Examples of the linear or branched alkyl group include a methyl group, ethyl group, propyl group, isopropyl group, n-butyl group, isobutyl group, tert-butyl group, pentyl group, isopentyl group, neopentyl group, and the like. The fluorinated alkyl group refers to the abovementioned alkyl groups of which the hydrogen atoms are partially or entirely substituted with fluorine atoms.

Preferably, the aforementioned $R^{11b}$ is a linear or branched alkyl group having 2 to 4 carbon atoms in view of higher contrast, proper resolution, and depth and width of focus, etc.; and preferably, $R^{13b}$, $R^{14b}$, $R^{16b}$, $R^{17b}$ are each a hydrogen atom or a methyl group.

The aforementioned $X^b$ and the neighboring carbon atoms form an alicyclic group having 5 to 20 carbon atoms. Specific examples of the alicyclic group are the groups of monocycloalkanes and polycycloalkanes such as bicycloalkanes, tricycloalkanes and tetracycloalkanes from which at least one hydrogen atom is removed. Specific examples thereof are monocycloalkanes such as cyclopentane, cyclohexane, cycloheptane and cyclooctane and polycycloalkanes such as adamantane, norbornane, isobornane, tricyclodecane and tetracyclododecane from which at least one hydrogen atom is removed. Particularly preferable are cyclohexane and adamantane from which at least one hydrogen atom is removed (that may further have a substituent).

When the alicyclic group of the abovementioned $X^b$ has a substituent on the ring skeleton, the substituent is exemplified by polar groups such as a hydroxide group, carboxyl group, cyano group and oxygen atom (=O), and linear or branched lower alkyl groups having 1 to 4 carbon atoms. The polar group is preferably an oxygen atom (=O) in particular.

The aforementioned $Y^b$ is an alicyclic group or an alkyl group; and examples thereof are monocycloalkanes and polycycloalkanes such as bicycloalkanes, tricycloalkanes and tetracycloalkanes from which at least one hydrogen atom is removed. Specific examples thereof are monocycloalkanes such as cyclopentane, cyclohexane, cycloheptane and cyclooctane, and polycycloalkanes such as adamantane, norbornane, isobornane, tricyclodecane and tetracyclododecane, from which at least one hydrogen atom is removed. Particularly preferable is adamantane from which at least one hydrogen atom is removed (that may further have a substituent).

When the alicyclic group of the abovementioned $Y^b$ has a substituent on the ring skeleton, the substituent is exemplified by polar groups such as a hydroxide group, carboxyl group, cyano group and oxygen atom (=O), and linear or branched lower alkyl groups having 1 to 4 carbon atoms. The polar group is preferably an oxygen atom (=O) in particular.

When $Y^b$ is an alkyl group, it is preferably a linear or branched alkyl group having 1 to 20 carbon atoms, and more preferably 6 to 15 carbon atoms. Preferably, the alkyl group is an alkoxyalkyl group in particular; and examples of the alkoxyalkyl group include a 1-methoxyethyl group, 1-ethoxyethyl group, 1-n-propoxyethyl group, 1-isopropoxyethyl group, 1-n-butoxyethyl group, 1-isobutoxyethyl group, 1-tert-butoxyethyl group, 1-methoxypropyl group, 1-ethoxypropyl group, 1-methoxy-1-methylethyl group, 1-ethoxy-1-methylethyl group, and the like.

Preferable specific examples of the structural unit represented by the above general formula (b5) are those represented by the following formulae (b5-1) to (b5-33).

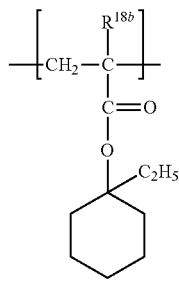

(b5-1)

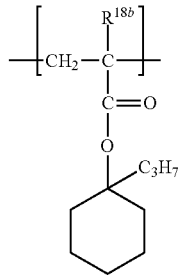

(b5-2)

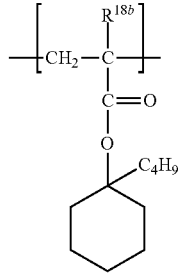

(b5-3)

(b5-4) 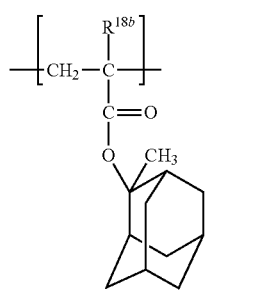
(b5-5) 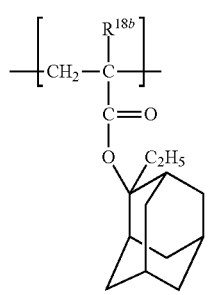
(b5-6) 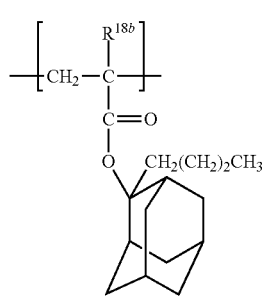
(b5-7) 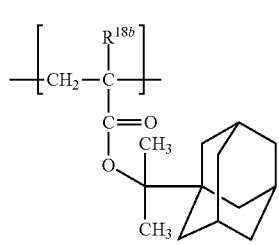
(b5-8) 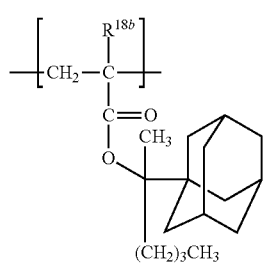
(b5-9) 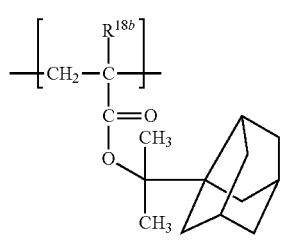
(b5-10) 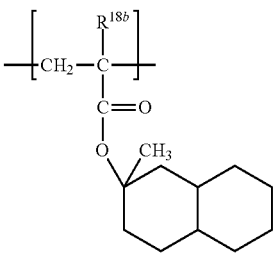
(b5-11) 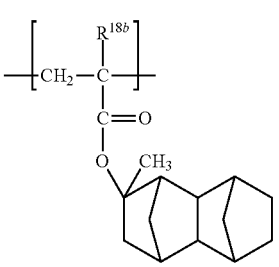
(b5-12) 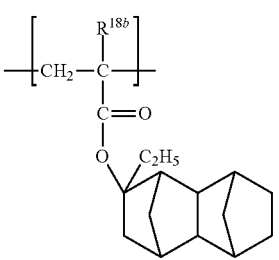
(b5-13) 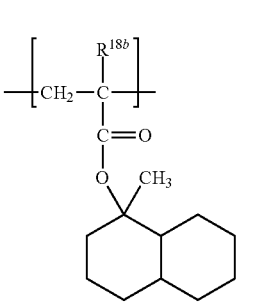
(b5-14) 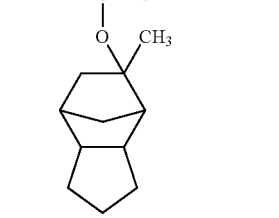

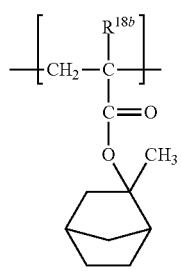
(b5-15)
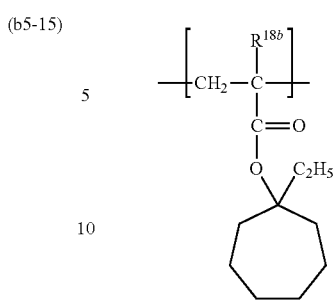
(b5-20)
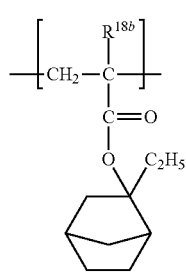
(b5-16)
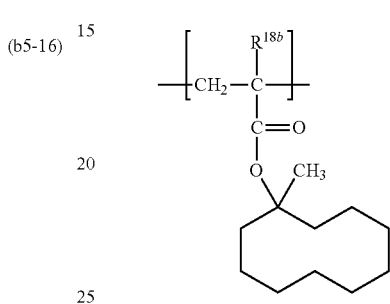
(b5-21)
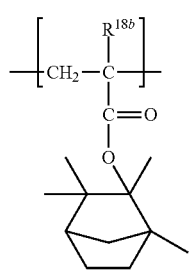
(b5-17)
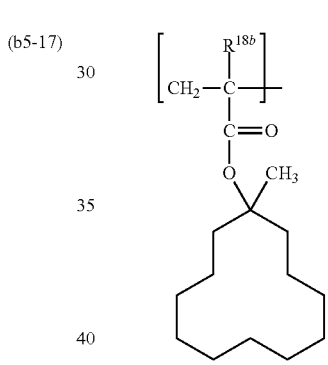
(b5-22)
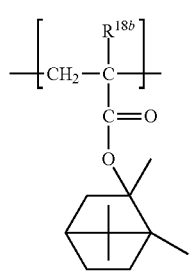
(b5-18)
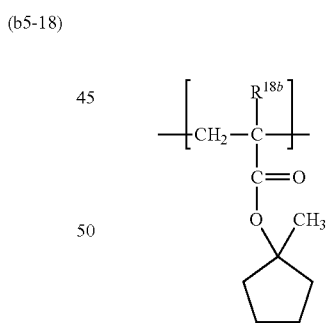
(b5-23)
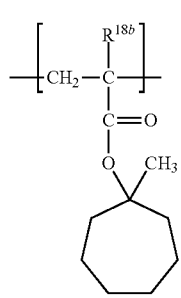
(b5-19)
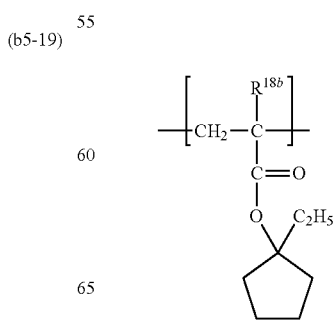
(b5-24)

(b5-25)
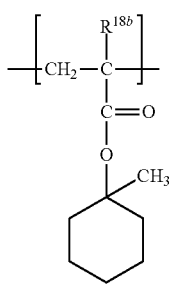
(b5-26)
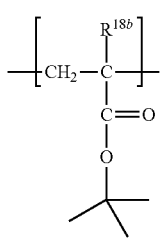
(b5-27)
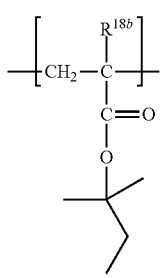
(b5-28)
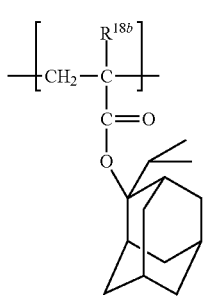
(b5-29)
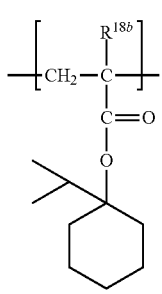
(b5-30)
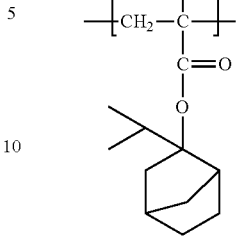
(b5-31)
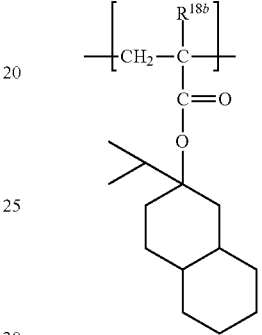
(b5-32)
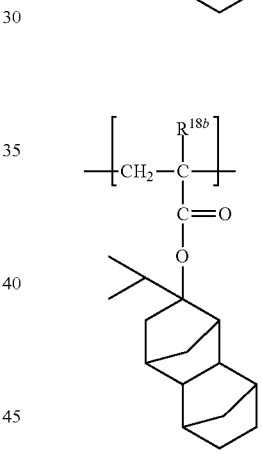
(b5-33)
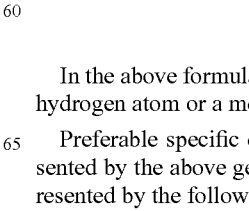
In the above formulae (b5-1) to (b5-33), $R^{18b}$ represents a hydrogen atom or a methyl group.
Preferable specific examples of the structural unit represented by the above general formula (b6) include those represented by the following formulae (b6-1) to (b6-24).

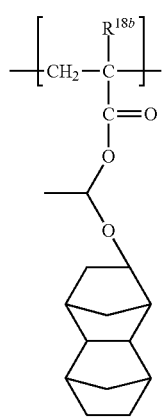 (b6-1)
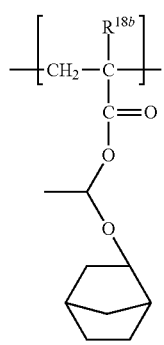 (b6-2)
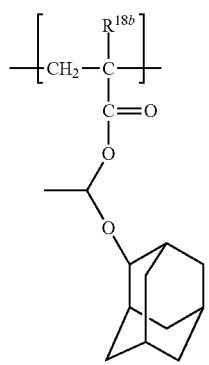 (b6-3)
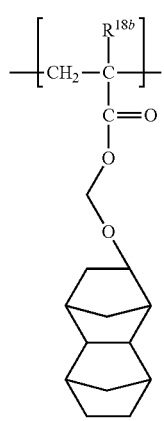 (b6-4)
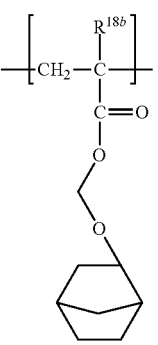 (b6-5)
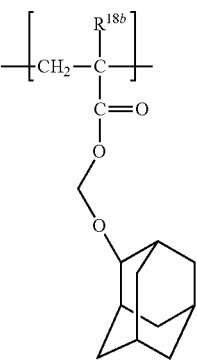 (b6-6)
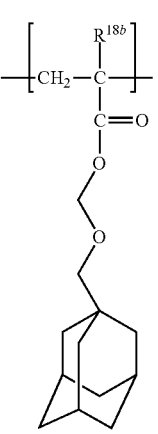 (b6-7)
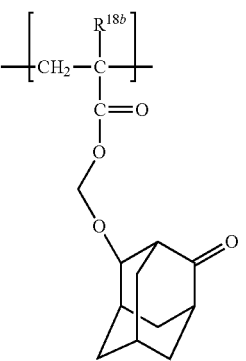 (b6-8)

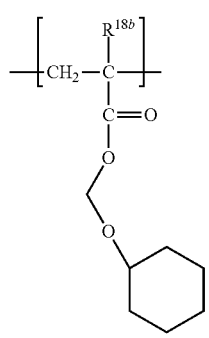 (b6-9)
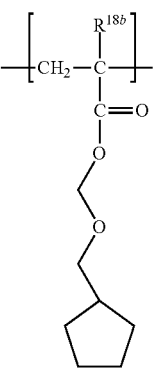 (b6-13)
(b6-10)
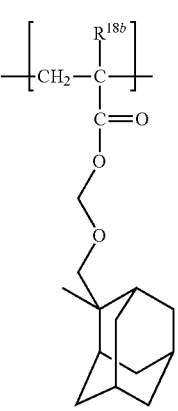 (b6-14)
(b6-11)
(b6-15)
(b6-12)
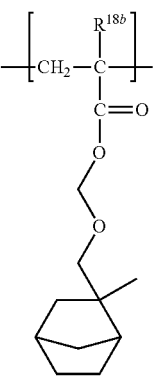
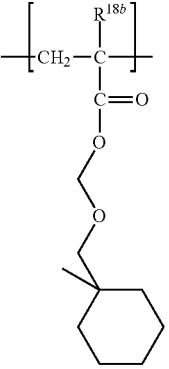 (b6-16)

(b6-17) 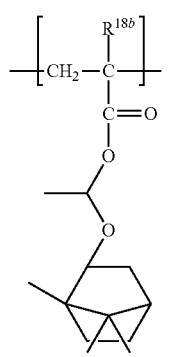
(b6-18) 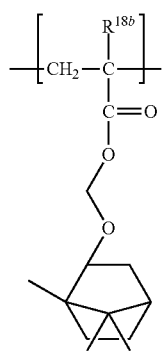
(b6-19) 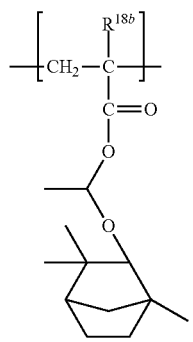
(b6-20) 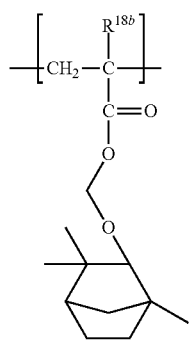
(b6-21) 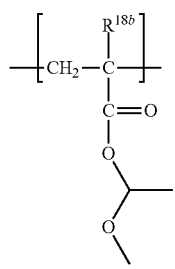
(b6-22) 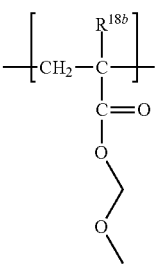
(b6-23) 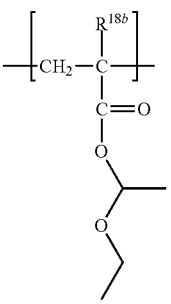
(b6-24) 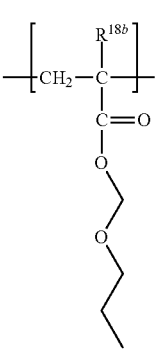
In the above formulae (b6-1) to (b6-24), $R^{18b}$ represents a hydrogen atom or a methyl group.
Preferable specific examples of the structural unit represented by the above general formula (b7) include those represented by the following formulae (b7-1) to (b7-15).
(b7-1) 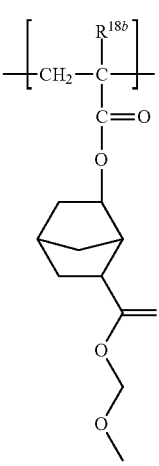

(b7-2)
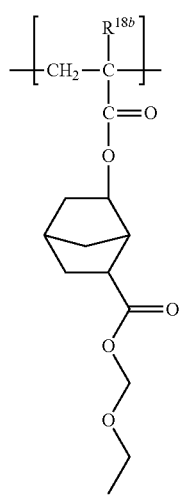
(b7-3)
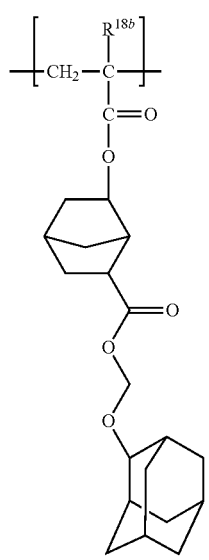
(b7-4)
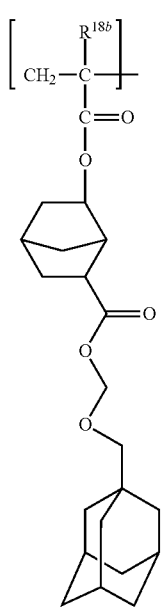
(b7-5)
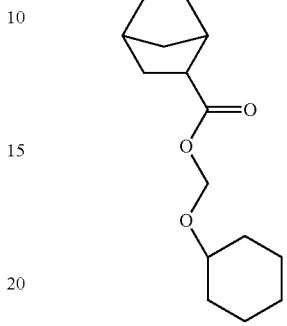
(b7-6)
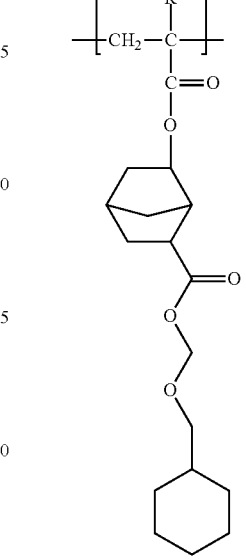
(b7-7)
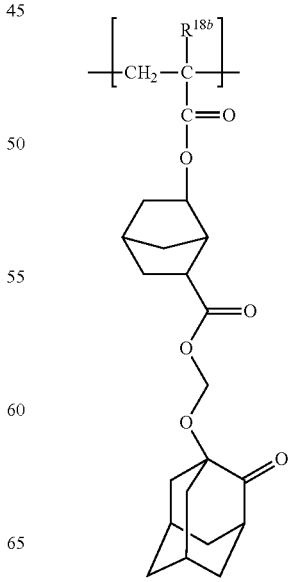

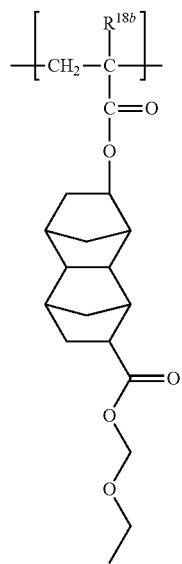 (b7-8)
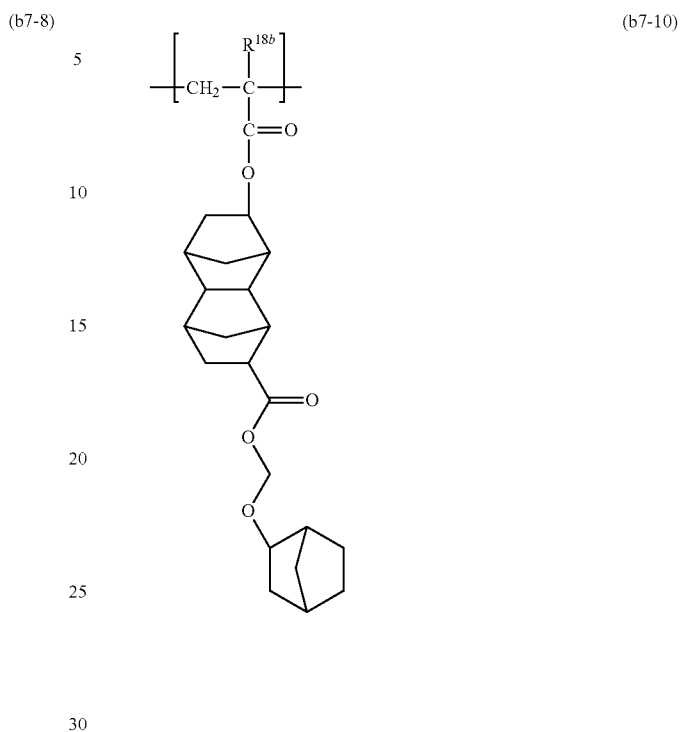 (b7-10)
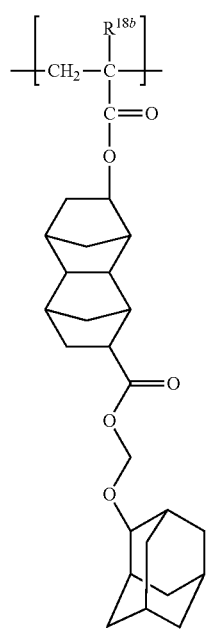 (b7-9)
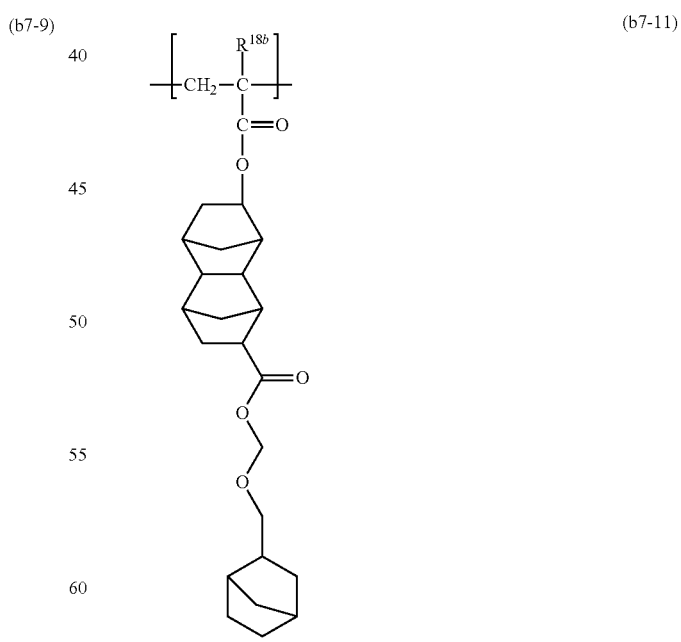 (b7-11)

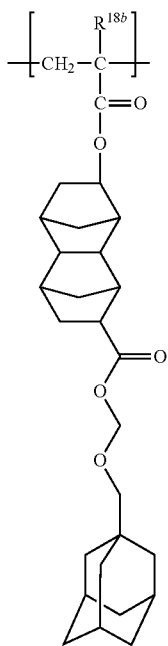

(b7-12)

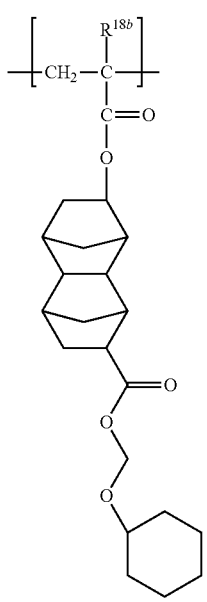

(b7-13)

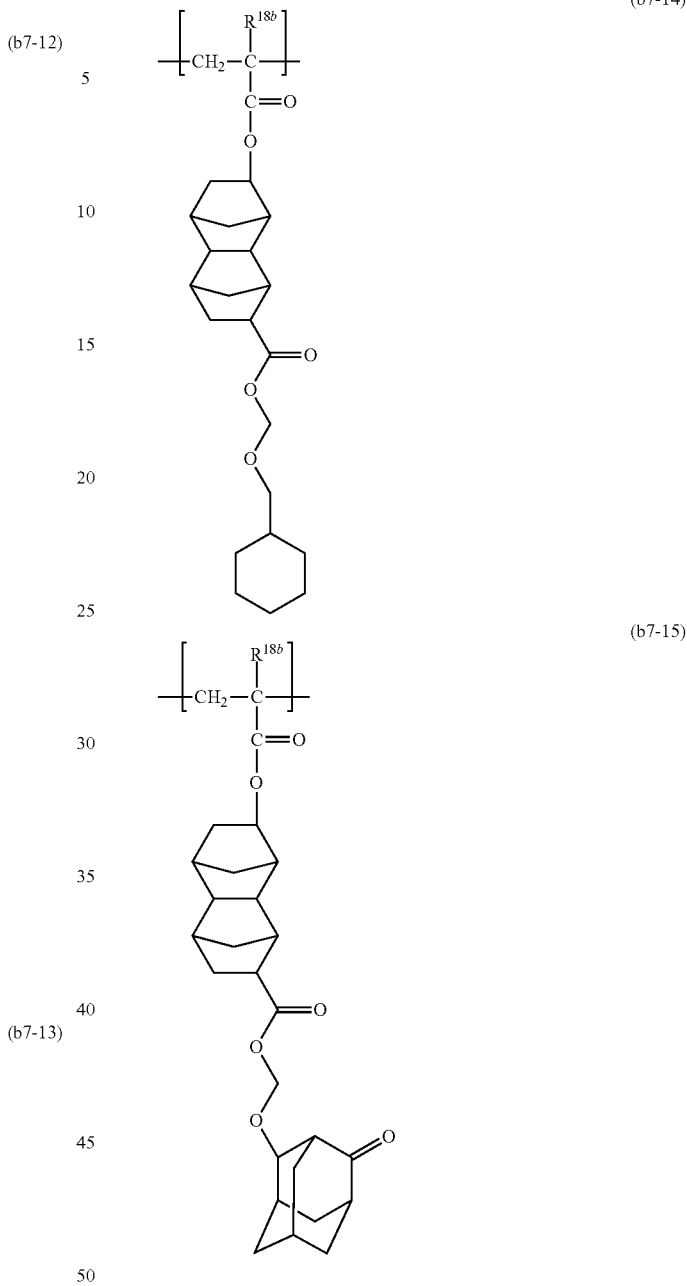

In the above formula (b7-1) to (b7-15), $R^{18b}$ represents a hydrogen atom or a methyl group.

It is also preferred that the acrylic resin (B3) includes a copolymer containing a structural unit derived from a polymerizable compound having an ether bond in addition to the structural unit represented by the above general formulae (b5) to (b7).

Illustrative examples of the polymerizable compound having an ether linkage include radical polymerizable compounds such as (meth)acrylic acid derivatives having an ether linkage and an ester linkage, and specific examples thereof include 2-methoxyethyl(meth)acrylate, 2-ethoxyethyl(meth)acrylate, methoxytriethylene glycol(meth)acrylate, 3-methoxybutyl(meth)acrylate, ethylcarbitol(meth)acrylate, phenoxypolyethylene glycol(meth)acrylate, methoxypolyethylene glycol(meth)acrylate, methoxypolypropylene glycol(meth)acrylate, tetrahydrofurfuryl (meth)acrylate, and the like. Also, the polymerizable compound having an ether linkage is preferably, 2-methoxyethyl (meth)acrylate, 2-ethoxyethyl(meth)acrylate, or methoxytriethylene glycol(meth)acrylate. These polymerizable compounds may be used alone, or in combinations of two or more thereof.

Furthermore, the acrylic resin (B3) may contain another polymerizable compound as a structural unit in order to moderately control physical or chemical properties. The polymerizable compound is exemplified by conventional radical polymerizable compounds and anion polymerizable compounds.

Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid and 2-methacryloyloxyethyl hexahydrophthalic acid; (meth)acrylic acid alkyl esters such as methyl(meth)acrylate, ethyl(meth)acrylate, butyl(meth)acrylate and cyclohexyl(meth)acrylate; (meth)acrylic acid hydroxyalkyl esters such as 2-hydroxyethyl(meth)acrylate and 2-hydroxypropyl(meth)acrylate; (meth)acrylic acid aryl esters such as phenyl(meth)acrylate and benzyl(meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide; and the like.

Furthermore, examples of the polymerizable compound include (meth)acrylic acid esters having a non-acid-dissociative aliphatic polycyclic group, and vinyl group-containing aromatic compounds. As the non-acid-dissociative aliphatic polycyclic group, particularly, a tricyclodecanyl group, an adamantyl group, a tetracyclododecanyl group, an isobornyl group, a norbornyl group, and the like are preferred from the viewpoint of easy industrial availability. These aliphatic polycyclic groups may have a linear or branched alkyl group having 1 to 5 carbon atoms as a substituent.

Specific examples of the (meth)acrylic acid esters having a non-acid-dissociative aliphatic polycyclic group include compounds having structures represented by the following formulae (b8-1) to (b8-5):

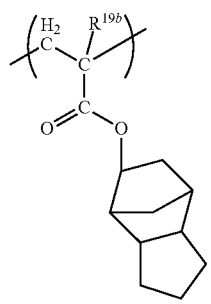
(b8-1)

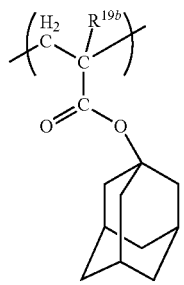
(b8-2)

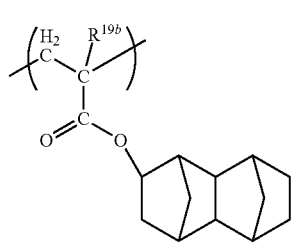
(b8-3)

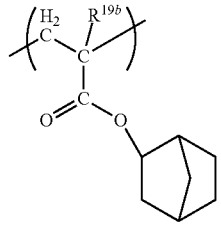
(b8-4)

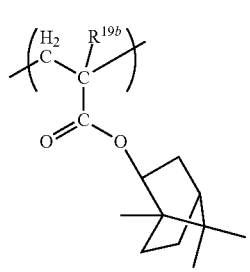
(b8-5)

where in formulae (b8-1) to (b8-5) $R^{19b}$ represents a hydrogen atom or a methyl group.

Among the resins (B), acrylic resins (B3) are preferably used. Among such acrylic resins (B3), a copolymer having a constituent unit represented by general formula (b5), a constituent unit derived from (meth)acrylic acid, a constituent unit derived from a (meth)acrylic acid alkyl ester, and a constituent unit derived from a (meth)acrylic acid aryl ester is preferred.

Such a copolymer is preferably a copolymer represented by the following general formula (b9):

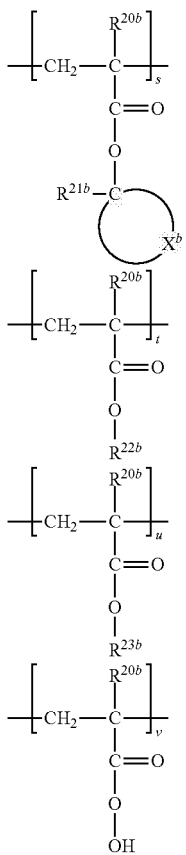

(b9)

In the above general formula (b9), $R^{20b}$ represents a hydrogen atom or a methyl group; $R^{21b}$ represents a linear or branched alkyl group having 2 to 4 carbon atoms; $X^b$ is as defined above; $R^{22b}$ represents a linear or branched alkyl group having 1 to 6 carbon atoms or an alkoxyalkyl group having 1 to 6 carbon atoms; and $R^{23b}$ represents an aryl group having 6 to 12 carbon atoms.

In regard to the copolymers represented by the above general formula (b9), s, t, u and v represent each molar ratio of the structural unit, with s being 8 to 45% by mole, t being 10 to 65% by mole, u being 3 to 25% by mole, and v being 6 to 25% by mole.

The polystyrene equivalent mass average molecular weight of the resin (B) is preferably 10,000 to 600,000, more preferably 2,000 to 40,000, and still more preferably 3,000 to 30,000. By thus adjusting the mass average molecular weight, the photoresist layer can maintain sufficient strength without deteriorating peel properties with supports, and also swelling of profiles in plating, and generation of cracks can be prevented.

It is also preferred that the resin (B) has a dispersivity of no less than 1.05. Dispersivity herein indicates a value of a mass average molecular weight divided by a number average molecular weight. A dispersivity in the range described above can avoid problems with respect to stress resistance on intended plating or possible swelling of metal layers resulting from the plating process.

The content of the resin (B) is preferably 5 to 60% by mass with respect to the total mass of the photoresist composition according to the present invention.

Alkali-Metal Salt (C)

The photoresist composition according to the present invention contains an alkali-metal salt of the following formula (C1) as the alkali-metal salt (C):

$$(W^+)_n X^{n-} \tag{C1}$$

(where in formula (C1) $W^+$ represents an alkali-metal ion; $X^{n-}$ represents a monovalent or a polyvalent counteranion; and n represents an integer of 1 or greater).

When the alkali-metal salt (C) is incorporated into the photoresist composition, in the case of forming a photoresist pattern for forming connecting terminals such as bumps or metal posts by using a photoresist composition, a photoresist pattern having a nonresist section in which the width of the bottom (the support surface side) is larger than the width of the top (the surface side of the photoresist layer), can be easily formed.

When a nonresist section in which the width of the bottom (the support surface side) is larger than the width of the top (the surface side of the photoresist layer) is formed, in the case of forming bumps, metal posts, and the like by embedding a conductor such as copper in the nonresist section on the resist pattern by plating, the contact area between the conductor embedded in the nonresist section and the support can be increased, and the adhesiveness of bumps, metal posts, and the like to the support can be improved.

In regard to the alkali-metal salt having formula (C1), $W^+$ is not particularly limited as long as it is an alkali-metal ion. Preferred examples of the alkali-metal ion include the lithium ion, sodium ion, potassium ion, rubidium ion, and cesium ion, and the lithium ion, sodium ion, and potassium ion are more preferred.

In regard to the alkali-metal salt having formula (C1), n represents an integer of 1 or greater, and is preferably an integer from 1 to 3, and more preferably 1. When n is 1, it is easy to prepare or acquire the alkali-metal salt having formula (C1), and the solubility of the alkali-metal salt having formula (C1) in the photoresist composition is satisfactory.

In regard to the alkali-metal salt having formula (C1), $X^{n-}$ represents a monovalent or polyvalent counteranion. $X^{n-}$ is not particularly limited as long as the desired effect can be obtained by adding the alkali-metal salt (C) to the photoresist composition, and is appropriately selected from various anions. As described above, n is preferably an integer from 1 to 3, and more preferably 1. Therefore, $X^{n-}$ is particularly preferably a monovalent anion.

Suitable examples of $X^{n-}$ include anions represented by the following formulae (C2) to (C14): Hereinafter, suitable monovalent anions will be described in order.

(Anion of Formula (C2))

$$[(R^{c1})_j PF_{6-j}]^- \tag{C2}$$

(where in formula (C2) $R^{c1}$ represents an alkyl group in which 80% or more of the hydrogen atoms are substituted by fluorine atoms. j represents the number of $R^{c1}$s, and represents an integer from 1 to 5. the $R^{c1}$s in the number of j may be respectively identical to or different from each other.)

In the anion represented by formula (C2), $R^{c1}$ represents an alkyl group substituted with a fluorine atom, and a preferred carbon number is 1 to 8, while a more preferred carbon number is 1 to 4. Specific examples of the alkyl group include linear alkyl groups such as methyl, ethyl, propyl, butyl, pentyl, and octyl; branched alkyl groups such as isopropyl, isobutyl, sec-butyl, and tert-butyl; and cycloalkyl groups such as cyclopropyl, cyclobutyl, cyclopentyl, and cyclohexyl. The proportion of the hydrogen atoms substituted by fluorine atoms in the alkyl groups is usually 80% or more, preferably 90% or more, and even more preferably 100%.

A particularly preferred $R^{c1}$ is a linear or branched perfluoroalkyl group having 1 to 4 carbon atoms and having a substitution ratio of fluorine atoms of 100%. Specific examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. The number j of $R^{c1}$ represents an integer from 1 to 5, and is preferably 2 to 4, and particularly preferably 2 or 3.

Suitable examples of the anion represented by formula (C2) include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2CF_2)_2PF_4]^-$, and $[(CF_3CF_2CF_2)_3PF_3]$. Among these, $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$, and $[((CF_3)_2CFCF_2)_2PF_4]^-$ are particularly preferred.

(Anion Having Formula (C3))

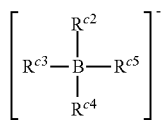

(C3)

(where in formula (C2) $R^{c2}$ to $R^{c5}$ each independently represents a fluorine atom or a phenyl group, and some or all of the hydrogen atoms of the phenyl group may be substituted by at least one selected from the group consisting of a fluorine atom and a trifluoromethyl group.)

Suitable examples of the anion represented by formula (C3) include tetrakis(pentafluorophenyl)borate ($[B(C_6F_5)_4]^-$), tetrakis[(trifluoromethyl)phenyl]borate ($[B(C_6H_4CF_3)_4]^-$), difluorobis(pentafluorophenyl)borate ($[(C_6F_5)_2BF_2]^-$), trifluoro(pentafluorophenyl)borate ($[(C_6F_5)BF_3]^-$), and tetrakis(difluorophenyl)borate ($[B(C_6H_3F_2)_4]^-$). Among these, tetrakis(pentafluorophenyl)borate ($[B(C_6F_5)_4]^-$) is particularly preferred.

(Anion Having Formula (C4))

$R^{c6}SO_3^-$ (C4)

(where in formula (C4) $R^{c6}$ represents a group represented by the following formula (C4-1), (C4-2), or (C4-3)):

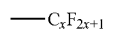

(C4-1)

(C4-2)

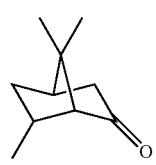

(C4-3)

(where in formula (C4-1) x represents an integer from 1 to 4; in formula (C4-2), $R^{c6-1}$ represents a hydrogen atom, a hydroxyl group, a linear or branched alkyl group having 1 to 6 carbon atoms, or a linear or branched alkoxy group having 1 to 6 carbon atoms; and y represents an integer from 1 to 3).

Suitable examples of the anion represented by formula (C4) include trifluoromethanesulfonic acid ion, heptafluoropropanesulfonic acid ion, nonafluorobutanesulfonic acid ion, benzenesulfonic acid ion, and p-toluenesulfonic acid ion.

(Anions of Formulae (C5) to (C12))

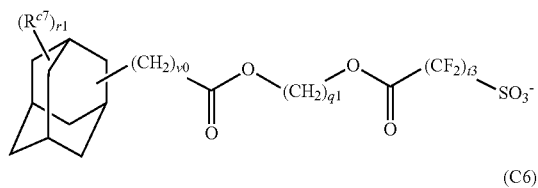

(C5)

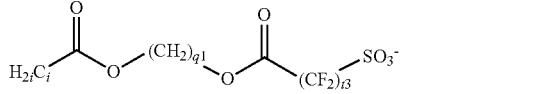

(C6)

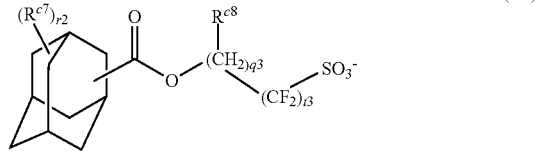

(C7)

(where in formulae (C5) to (C7) v0 represents an integer from 0 to 3; q1 and q2 each independently represents an integer from 1 to 5; q3 represents an integer from 1 to 12; r1 and r2 each independently represents an integer from 0 to 3; i represents an integer from 1 to 20; t3 represents an integer from 1 to 3; $R^{c7}$ represents a substituent; and $R^{c8}$ represents a hydrogen atom, an alkyl group or a halogenated alkyl group having 1 to 5 carbon atoms.)

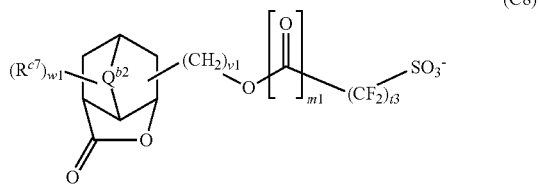

(C8)

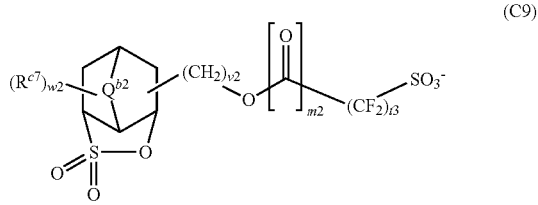

(C9)

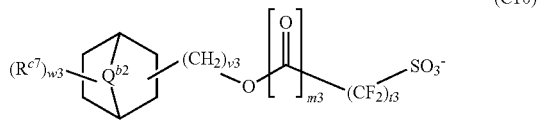

(C10)

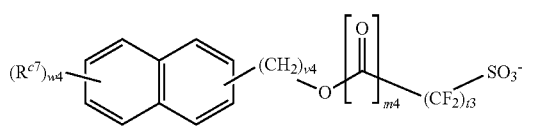

(C11)

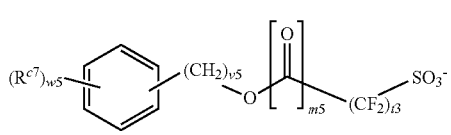

(where in formulae (C8) to (C12) t3 and $R^{c7}$ have the same definitions as t3 and $R^{c7}$ in formulae (C5) to (C7), respectively; $Q^{b2}$ represents an alkylene group which may contain an oxygen atom or a sulfur atom, an oxygen atom or a sulfur atom; m1 to m5 each independently represents 0 or 1; v1 to v5 each independently represents an integer from 0 to 3; and w1 to w5 each independently represents an integer from 0 to 3).

In formulae (C5) to (C12), examples of the substituent for $R^{c7}$ include an alkyl group and a heteroatom-containing substituent.

When $R^{c7}$ is an alkyl group, the carbon number is preferably 1 to 5. Suitable examples of the alkyl group in the case where $R^{c7}$ is an alkyl group, include a methyl group, an ethyl group, a propyl group, an n-butyl group, and a tert-butyl group.

When $R^{c7}$ is a heteroatom-containing substituent, the heteroatom that is contained in the substituent is not particularly limited as long as it is an atom other than a carbon atom and a hydrogen atom. Examples of the heteroatom include a halogen atom, an oxygen atom, a sulfur atom, and a nitrogen atom. Examples of the halogen atom include a fluorine atom, a chlorine atom, an iodine atom, and a bromine atom.

The heteroatom-containing substituent may be a group composed only of heteroatoms, or may be a group containing a group or atom other than heteroatoms.

Examples of the heteroatom-containing substituent include a halogen atom, an alkoxy group, a hydroxyl group, —C(=O)—$R^{c7-1}$ [where $R^{c7-1}$ represents an alkyl group], —COO$R^{c7-2}$ [where $R^{c7-2}$ represents a hydrogen atom or an alkyl group], a halogenated alkyl group, a halogenated alkoxy group, a hydroxyalkyl group, an amino group, an amide group, a nitro group, an oxygen atom (=O), a sulfur atom, and a sulfonyl group ($SO_2$).

When the heteroatom-containing substituent is a halogen atom, examples of the halogen atom include a fluorine atom, a chlorine atom, a bromine atom, and a chlorine atom, and a fluorine atom is preferred.

When the heteroatom-containing substituent is an alkoxy group, the alkyl group contained in the alkoxy group may be any of linear, branched, or cyclic, or may be a combination of these. The carbon number of the alkyl group contained in the alkoxy group is preferably 1 to 30.

When the alkyl group that is contained in the alkoxy group is linear or branched, the carbon number of the alkyl group is preferably 1 to 20, more preferably 1 to 17, even more preferably 1 to 15, and particularly preferably 1 to 10.

Suitable examples of the alkyl group in the case where the alkyl group contained in the alkoxy group is a linear alkyl group include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

Suitable examples of the alkyl group in the case where the alkyl group contained in the alkoxy group is a branched alkyl group include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

When the alkyl group that is contained in the alkoxy group is cyclic (in the case of a cycloalkyl group), the carbon number of the alkyl group is preferably 3 to 30, more preferably 3 to 20, even more preferably 3 to 15, particularly preferably 4 to 12, and most preferably 5 to 10.

When the alkyl group that is contained in the alkoxy group is cyclic, the alkyl group may be monocyclic or polycyclic. Specific examples thereof include a group obtained by eliminating one or more hydrogen atoms from a monocycloalkane, and a group obtained by eliminating one or more hydrogen atoms from a polycycloalkane such as a bicycloalkane, a tricycloalkane, or a tetracycloalkane. Specific examples of the monocycloalkane include cyclopentane and cyclohexane. Furthermore, specific examples of the polycycloalkane include adamantane, norbornane, isobornane, tricyclodecane, and tetracyclododecane. These cycloalkyl groups are such that a part or all of the hydrogen atoms bonded to the ring may or may not be substituted by substituents such as a fluorine atom and a fluorinated alkyl group.

In regard to —C(=O)—$R^{c7-1}$ and —COO$R^{c7-2}$ as the heteroatom-containing substituents, examples of the alkyl group in $R^{c7-1}$ and $R^{c7-2}$ include the same groups as the alkyl groups listed as the alkyl groups that are contained in the aforementioned alkoxy group.

Examples of the alkyl group in the halogenated alkyl group as the heteroatom-containing substituent include the same groups as the alkyl groups listed as the alkyl groups that are contained in the alkoxy group. As the halogenated alkyl group, a fluorinated alkyl group is particularly preferred.

Examples of the halogenated alkoxy group as the heteroatom-containing substituent include the aforementioned alkoxy groups in which some or all of the hydrogen atoms are substituted by the foregoing halogen atoms. The halogenated alkoxy group is preferably a fluorinated alkoxy group.

Examples of the hydroxyalkyl group as the heteroatom-containing substituent include groups in which at least one of the hydrogen atoms of the alkyl groups listed as the alkyl groups for the aforementioned alkoxy group is substituted by a hydroxyl group. The number of hydroxyl groups carried by the hydroxyalkyl group is preferably 1 to 3, and more preferably 1.

In formulae (C5) to (C12), when the symbols assigned to $R^{c7}$ (r1 to r2 and w1 to w5) represent integers of 2 or greater, plural $R^{c7}$s in the same compound may be identical to or different from each other.

In formulae (C8) to (C10), the alkylene group for $Q^{b2}$ is preferably linear or branched, and the carbon number thereof is preferably 1 to 5. Specific examples thereof include a methylene group [—$CH_2$—]; an alkylmethylene group such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, or —C($CH_2CH_3$)$_2$—; an ethylene group [—$CH_2CH_2$—]; an alkylethylene group such as CH($CH_3$)$CH_2$—, —CH($CH_3$)CH($CH_3$)—, —C($CH_3$)$_2CH_2$—, or —CH($CH_2CH_3$)$CH_2$—; a trimethylene group (n-propylene group) [—$CH_2CH_2CH_2$—]; an alkyltrimethylene group such as —CH($CH_3$)$CH_2CH_2$— or —$CH_2$CH($CH_3$)$CH_2$—; a tetramethylene group [—$CH_2CH_2CH_2CH_2$—]; an alkyltetramethylene group such as —CH($CH_3$)$CH_2CH_2CH_2$— or —$CH_2$CH($CH_3$)$CH_2CH_2$—; and a pentamethylene group [—$CH_2CH_2CH_2CH_2CH_2$—]. Among these, a methylene group or an alkylmethylene group is preferred, and a methylene group, —CH(CH$_3$)— or —C(CH$_3$)$_2$—, is particularly preferred.

When Q$^{b2}$ is an alkylene group, the alkylene group may contain an oxygen atom (—O—) or a sulfur atom (—S—). Specific examples thereof include groups in which alkylene groups are interrupted by —O— or —S— at the ends or between carbon atoms. Among them, —O—CH$_2$—, —CH$_2$—O—CH$_2$—, —S—CH$_2$—, —CH$_2$—S—CH$_2$—, and the like are preferred.

In formula (C7), the alkyl group for R$^{c8}$ as a halogenated alkyl group may be any of linear, branched, or cyclic.

When R$^{c8}$ is a linear or branched alkyl group, the carbon number is preferably 1 to 10, more preferably 1 to 8, and particularly preferably 1 to 4. When R$^{c8}$ is a cyclic alkyl group, the carbon number is preferably 4 to 15, more preferably 4 to 10, and particularly preferably 6 to 10.

Examples of the halogenated alkyl group for R$^{c8}$ include groups in which a part or all of the hydrogen atoms of the aforementioned linear, branched, or cyclic alkyl groups are substituted by halogen atoms. Examples of the halogen atom include a fluorine atom, a chlorine atom, a bromine atom, and an iodine atom, and a fluorine atom is preferred.

In regard to the halogenated alkyl group for R$^{c8}$, the proportion of the number of halogen atoms with respect to the total number of the halogen atoms and hydrogen atoms contained in the halogenated alkyl group (halogenation ratio (%)) is preferably 10% to 100%, more preferably 50% to 100%, and most preferably 100%.

In formulae (C5) to (C12), r1 to r2 and w1 to w5 are each preferably an integer from 0 to 2, and more preferably 0 or 1. v0 to v5 are each preferably 0 to 2, and more preferably 0 or 1. t3 is preferably 1 or 2, and more preferably 1. q3 is preferably an integer from 1 to 5, more preferably an integer from 1 to 3, and particularly preferably 1.

(Anions Having Formulae (C13) and (C14))

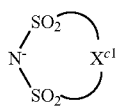

(C13)

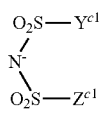

(C14)

where in formulae (C13) and (C14) X$^{c1}$ represents an alkylene group having 2 to 6 carbon atoms in which at least 1 hydrogen atom is substituted by a fluorine atom; and Y$^{c1}$ and Z$^{c1}$ each independently represent an alkyl group having 1 to 10 carbon atoms in which at least 1 hydrogen atom is substituted by a fluorine atom.

In formula (C13), X$^{c1}$ represents a linear or branched alkylene group in which at least 1 hydrogen atom is substituted by a fluorine atom, and the carbon number of the alkylene group is 2 to 6, preferably 3 to 5, and more preferably 3.

In formula (C14) Y$^{c1}$ and Z$^{c1}$ each independently represents a linear or branched alkyl group in which at least 1 hydrogen atom is substituted by a fluorine atom, and the carbon number of the alkyl group is 1 to 10, preferably 1 to 7, and more preferably 1 to 3.

It is more preferable that the carbon number of the alkylene group for X$^{c1}$ or the carbon number of the alkyl group for Y$^{c1}$ and Z$^{c2}$ be smaller in the range of the carbon number.

The proportion of fluorine atoms in the alkyl group, the alkylene group or the alkyl group for X$^{c1}$, Y$^{c1}$ and Z$^{c2}$, that is, the fluorination ratio, is preferably 70% to 100%, more preferably 90% to 100%, and particularly preferably 100%. That is, a perfluoroalkylene group or a perfluoroalkyl group in which all the hydrogen atoms are substituted by fluorine atoms is particularly preferred.

The content of alkali-metal salt (C) in the photoresist composition is not particularly limited as long as the purpose of the present invention is not impaired. The content of alkali-metal salt (C) is typically preferably 1000 ppm to 100,000 ppm by mass, and more preferably 2000 ppm to 80,000 ppm by mass, relative to the mass of acid generator (A). When the content of alkali-metal salt (C) is adjusted to the range described above, a photoresist composition that provides a desired effect without adversely affecting the characteristics of the photoresist composition or the performance of connecting terminals that are formed by using the photoresist composition may be easily obtained. Alkali-metal salt (C) is such that one kind may be used, or two or more kinds may be used in combination.

Alkali-Soluble Resin (D)

It is preferred that the photoresist composition according to the present invention further contains an alkali-soluble resin (D) in order to improve crack resistance. The alkali-soluble resin as referred to herein may be determined as follows. A solution of the resin to give a resin concentration of 20% by mass (solvent: propylene glycol monomethyl ether acetate) is used to form a resin film having a film thickness of 1 µm on a substrate, and immersed in an aqueous 2.38% by mass TMAH solution for 1 min. If the resin was dissolved in an amount of no less than 0.01 µm, the resin is defined to be alkali soluble. The alkali-soluble resin (D) is preferably at least one selected from the group consisting of novolak resins (D1), polyhydroxystyrene resins (D2) and acrylic resins (D3).

Novolak Resin (D1)

The novolak resin (D1) may be prepared by addition condensation between, for example, aromatic compounds having a phenolic hydroxy group (hereinafter, merely referred to as "phenols") and aldehydes in the presence of an acid catalyst.

Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethyl phenol, 3,4,5-trimethyl phenol, p-phenylphenol, resorcinol, hydroquinone, hydroquinone monomethyl ether, pyrogallol, phloroglycinol, hydroxydiphenyl, bisphenol A, gallic acid, gallic acid ester, α-naphthol, β-naphthol, and the like.

Examples of the aldehydes include formaldehyde, furfural, benzaldehyde, nitrobenzaldehyde, acetaldehyde, and the like.

The catalyst used in the addition condensation reaction, which is not specifically limited, is exemplified by hydrochloric acid, nitric acid, sulfuric acid, formic acid, oxalic acid, acetic acid, etc., in regards to acid catalyst.

The flexibility of the novolak resins can be enhanced still more when o-cresol is used, a hydrogen atom of a hydroxide group in the resins is substituted with other substituents, or bulky aldehydes are used.

The mass average molecular weight [sic] of novolac resin (D1) is not particularly limited as long as the purpose of the present invention is not impaired, but the mass average molecular weight is preferably 1,000 to 50,000.

Polyhydroxystyrene Resin (D2)

The hydroxystyrene compound to constitute the polyhydroxystyrene resin (D2) is exemplified by p-hydroxystyrene, α-methylhydroxystyrene, α-ethylhydroxystyrene, and the like.

Among these, the polyhydroxystyrene resin (C2) is preferably prepared to give a copolymer with a styrene resin. The styrene compound to constitute the styrene resin is exemplified by styrene, chlorostyrene, chloromethylstyrene, vinyltoluene, α-methylstyrene, and the like.

The mass average molecular weight of the polyhydroxystyrene resin (D2) is not particularly limited as long as the purpose of the present invention is not impaired, but the mass average molecular weight is preferably 1,000 to 50,000.

Acrylic Resin (D3)

It is preferred that the acrylic resin (D3) includes a structural unit derived from a polymerizable compound having an ether linkage and a structural unit derived from a polymerizable compound having a carboxyl group.

Illustrative examples of the polymerizable compound having an ether linkage include (meth)acrylic acid derivatives having an ether linkage and an ester linkage such as 2-methoxyethyl(meth)acrylate, methoxytriethylene glycol(meth)acrylate, 3-methoxybutyl(meth)acrylate, ethylcarbitol(meth)acrylate, phenoxypolyethylene glycol(meth)acrylate, methoxypolypropylene glycol(meth)acrylate, tetrahydrofurfuryl(meth)acrylate, and the like. The polymerizable compound having an ether linkage is preferably, 2-methoxyethyl acrylate, and methoxytriethylene glycol acrylate. These polymerizable compounds may be used alone, or in combinations of two or more.

Illustrative examples of the polymerizable compound having a carboxyl group include monocarboxylic acids such as acrylic acid, methacrylic acid and crotonic acid; dicarboxylic acids such as maleic acid, fumaric acid and itaconic acid; compounds having a carboxyl group and an ester linkage such as 2-methacryloyloxyethyl succinic acid, 2-methacryloyloxyethyl maleic acid, 2-methacryloyloxyethyl phthalic acid and 2-methacryloyloxyethyl hexahydrophthalic acid. The polymerizable compound having a carboxyl group is preferably, acrylic acid and methacrylic acid. These polymerizable compounds may be used alone, or in combinations of two or more thereof.

The mass average molecular weight of the acrylic resin (D3) is not particularly limited as long as the purpose of the present invention is not impaired, but the mass average molecular weight is preferably 50,000 to 800,000.

The content of alkali-soluble resin (D) is such that when the total amount of resin (B) and alkali-soluble resin (D) is taken as 100 parts by mass, the content is preferably 0 parts to 80 parts by mass, and more preferably 0 parts to 60 parts by mass. By adjusting the content of alkali-soluble resin (D) to the range described above, there is a tendency for resistance to cracking to increase, and film loss at the time of development can be prevented.

Acid Diffusion Control Agent (E)

In order to improve the photoresist pattern configuration, the post exposure stability and the like, it is preferred that the photoresist composition according to the present invention further contains (E) an acid diffusion control agent. The acid diffusion control agent (E) is preferably (E1) a nitrogen-containing compound, and (E2) an organic carboxylic acid, or an oxo acid of phosphorus or a derivative thereof may be further included as needed.

Nitrogen-Containing Compound (E1)

Examples of the nitrogen-containing compound (E1) include trimethylamine, diethylamine, triethylamine, di-n-propylamine, tri-n-propylamine, tri-n-pentylamine, tribenzylamine, diethanolamine, triethanolamine, n-hexylamine, n-heptylamine, n-octylamine, n-nonylamine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1,3,3,-tetramethylurea, 1,3-diphenylurea, imidazole, benzimidazole, 4-methylimidazole, 8-oxyquinoline, acridine, purine, pyrrolidine, piperidine, 2,4,6-tri(2-pyridyl)-S-triazine, morpholine, 4-methylmorpholine, piperazine, 1,4-dimethylpiperazine, 1,4-diazabicyclo[2.2.2]octane, pyridine and the like. These may be used alone, or in combinations of two or more thereof.

The nitrogen-containing compound (E1) may be used in an amount typically in the range of 0 to 5 parts by mass, and particularly in the range of 0 to 3 parts by mass, with respect to 100 parts by mass of total mass of the resin (B) and the alkali-soluble resin (D).

Organic Carboxylic Acid or Oxo Acid of Phosphorus or Derivative Thereof (E2)

Among the organic carboxylic acid, or the oxo acid of phosphorus or the derivative thereof (E2), specific preferred examples of the organic carboxylic acid include malonic acid, citric acid, malic acid, succinic acid, benzoic acid, salicylic acid and the like, and salicylic acid is particularly preferred.

Among the organic carboxylic acid, or the oxo acid of phosphorus or the derivative thereof (D2), specific preferred examples of the organic carboxylic acid include malonic acid, citric acid, malic acid, succinic acid, benzoic acid, salicylic acid and the like, and salicylic acid is particularly preferred. Examples of the oxo acid of phosphorus or derivatives thereof include phosphoric acid and derivatives such as esters thereof such as, e.g., phosphoric acid, phosphoric acid di-n-butyl ester, and phosphoric acid diphenyl ester; phosphonic acid and derivatives such as esters thereof such as, e.g., phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives such as esters thereof such as, e.g., phosphinic acid and phenylphosphinic acid; and the like. Among these, phosphonic acid is particularly preferred. These may be used alone, or in combinations of two or more thereof.

The organic carboxylic acid, or the oxo acid of phosphorus or the derivative thereof (E2) may be used in an amount typically in the range of 0 to 5 parts by mass, and particularly in the range of 0 to 3 parts by mass, with respect to 100 parts by mass of total mass of the resin (B) and the alkali-soluble resin (D).

Moreover, in order to form a salt to allow for stabilization, the organic carboxylic acid, or the oxo acid of phosphorous or the derivative thereof (E2) is preferably used in an amount equivalent to that of the nitrogen-containing compound (E1).

Organic Solvent (S)

The photoresist composition according to the present invention contains an organic solvent (S). The kind of organic solvent (S) is not particularly limited as long as the purpose of the present invention is not impaired, and the organic solvent can be appropriately selected for use from the organic solvents that have been conventionally used in positive-type photoresist compositions.

Specific examples of the organic solvent (S) include ketones such as acetone, methyl ethyl ketone, cyclohexanone, methyl isoamyl ketone, and 2-heptanone; polyhydric alcohols and derivatives thereof, like monomethyl ethers, monoethyl ethers, monopropyl ethers, monobutyl ethers and monophenyl ethers, such as ethylene glycol, ethylene glycol monoacetate, diethylene glycol, diethylene glycol monoacetate, propylene glycol, propylene glycol monoacetate, dipropylene glycol and dipropylene glycol monoacetate; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, methyl pyruvate, ethylethoxy acetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanate, 3-methoxybutyl acetate and 3-methyl-3-methoxybutyl acetate; aromatic hydrocarbons such as toluene and xylene; and the like. These may be used alone, or as a mixture of two or more thereof.

The content of the organic solvent (S) is not particularly limited as long as the purpose of the present invention is not impaired. When the resist composition is used for a thick-film application in which a photoresist layer obtainable by a spin-coating method or the like has a film thickness of 5 μm or greater, it is preferable to use organic solvent (S) to the extent that the solid concentration of the photoresist composition according to the present invention is 30% to 55% by mass.

Other Components

The photoresist composition according to the present invention may further contain a polyvinyl resin for improving plasticity. Specific examples of the polyvinyl resin include polyvinyl chloride, polystyrene, polyhydroxystyrene, polyvinyl acetate, polyvinylbenzoic acid, polyvinyl methyl ether, polyvinyl ethyl ether, polyvinyl alcohol, polyvinyl pyrrolidone, polyvinyl phenol, and copolymers thereof, and the like. The polyvinyl resin is preferably polyvinyl methyl ether in view of lower glass transition temperatures.

Furthermore, the photoresist composition according to the present invention may further contain an adhesion aid, in order to enhance the adhesiveness to the support.

Also, the photoresist composition according to the present invention may further contain a surfactant for improving coating characteristics, defoaming characteristics, leveling characteristics and the like. Specific examples of the surfactant include commercially available fluorochemical surfactants such as BM-1000 and BM-1100 (both manufactured by B.M-Chemie Co., Ltd.), Megafac F142D, Megafac F172, Megafac F173 and Megafac F183 (all manufactured by Dainippon Ink And Chemicals, Incorporated), Flolade FC-135, Flolade FC-170C, Flolade FC-430 and Flolade FC-431 (all manufactured by Sumitomo 3M Ltd.), Surflon S-112, Surflon S-113, Surflon S-131, Surflon S-141 and Surflon S-145 (all manufactured by Asahi Glass Co., Ltd.), SH-28PA, SH-190, SH-193, SZ-6032 and SF-8428 (all manufactured by Toray Silicone Co., Ltd.), but not limited thereto.

Additionally, in order to finely adjust the solubility in a developing solution, the photoresist composition according to the present invention may further contain an acid, an acid anhydride, or a solvent having a high boiling point.

Specific examples of the acid and acid anhydride include monocarboxylic acids such as acetic acid, propionic acid, n-butyric acid, isobutyric acid, n-valeric acid, isovaleric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; polyvalent carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, butanetetracarboxylic acid, trimellitic acid, pyromellitic acid, cyclopentanetetracarboxylic acid, butanetetracarboxylic acid, and 1,2,5,8-naphthalenetetracarboxylic acid; acid anhydrides such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, Himic anhydride, 1,2,3,4-butanetetracarboxylic acid, cyclopentanetetracarboxylic dianhydride, phthalic anhydride, pyromellitic anhydride, trimellitic anhydride, benzophenonetetracarboxylic anhydride, ethylene glycol bis anhydrous trimellitate, and glycerin tris anhydrous trimellitate; and the like.

Furthermore, specific examples of the solvent having a high boiling point include N-methylformamide, N,N-dimethylformamide, N-methylformanilide, N-methylacetamide, N,N-dimethlyacetamide, N-methylpyrrolidone, dimethyl sulfoxide, benzyl ethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like.

Moreover, the photoresist composition according to the present invention may further contain a sensitizer for improving the sensitivity.

Preparation of Photoresist Composition

A method for preparing the photoresist composition according to the present invention may be only mixing and stirring each of the aforementioned components by a conventional method. Each of the aforementioned components may be dispersed and mixed using dispersion equipment such as a dissolver, a homogenizer, or a three-roll mill, if necessary. Thereafter, the mixture may further be filtrated using a mesh, a membrane filter, or the like.

Photoresist Laminate

The photoresist laminate of the present invention is a product in which a photoresist layer formed from the chemically amplified positive-type photoresist composition is laminated on a support. There are no particular limitations on the support, and conventionally known supports may be used. For example, substrates for electronic components, including substrates having predetermined wiring patterns formed thereon, may be cited as examples. Examples of the substrate include substrates made of metals such as silicon, silicon nitride, titanium, tantalum, palladium, titanium-tungsten, copper, chromium, iron, and aluminum; and glass substrates. Examples of the material used for the wiring patterns include copper, solder, chromium, aluminum, nickel, and gold.

The support is preferably a support in which the material of the surface that is brought into contact with the photoresist layer is copper. In the case where such a support is used, when a photoresist pattern for forming connecting terminals is formed by using the resist composition according to the present invention, a photoresist pattern having a nonresist section in which the width of the bottom (the support surface side) is larger than the width of the top (the surface side of the photoresist layer) can be easily formed.

The photoresist laminate as described above can be produced, for example, as follows. That is, the desired coating film is formed by applying on a support a solution of a photoresist composition prepared as described above, and removing the solvent by heating. Regarding the method for applying the solution on a support to be treated, a spin-coating method, a slit-coating method, a roll-coating method, a screen-printing method, an applicator method, and the like can be employed. The prebake conditions for a coating film of the composition of the present invention may vary depending on the kinds of the various components in the composition, the mixing proportions, the coating-film thickness, and the like, but the prebake conditions are usually 70° C. to 150° C., and preferably 80° C. to 140° C., for about 2 to 60 minutes.

There are no particular limitations on the film thickness of the photoresist layer in the photoresist laminate, but the film thickness is preferably 10 μm to 150 μm, more preferably 20 μm to 120 μm, and particularly preferably 20 μm to 80 μm.

Method for Producing Photoresist Pattern

The method for producing a photoresist pattern according to the present invention includes a laminating step of laminating on a support a photoresist layer formed from the photoresist composition according to the present invention; an exposure step of irradiating the photoresist layer with an active ray or radiation; and a developing step of developing the photoresist layer after exposure, thereby obtaining a photoresist pattern.

In order to form a photoresist pattern by using the photoresist laminate obtained as described above, the photoresist layer thus formed is selectively irradiated (exposed) with an active ray or radiation, for example, ultraviolet radiation having a wavelength of 300 nm to 500 nm or visible light, through a mask of a predetermined pattern.

Low pressure mercury lamps, high pressure mercury lamps, super high pressure mercury lamps, metal halide lamps, argon gas lasers, etc. can be used for the light source of the radiation. The radiation may include micro waves, infrared rays, visible lights, ultraviolet rays, X-rays, γ-rays, electron beams, proton beams, neutron beams, ion beams, etc. The irradiation dose of the radiation may vary depending on the constituent of the photoresist composition according to the present invention, the film thickness of the photoresist layer, and the like. For example, when an ultra high-pressure mercury lamp is used, the dose may be 100 to 10,000 mJ/cm$^2$. The radiation includes a light ray to activate the acid generator (A) in order to generate an acid.

After the exposure, diffusion of the acid is promoted through heating by conventional processes, followed by changing the alkali solubility of the photoresist layer in this exposed region.

Next, in the development step, for example, a certain aqueous alkaline solution is used as a developing solution to dissolve and remove unwanted regions, whereby a predetermined photoresist pattern is produced.

As the developing solution, an aqueous solution of an alkali such as, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene or 1,5-diazabicyclo[4.3.0]-5-nonane can be used. Also, an aqueous solution prepared by adding an adequate amount of a water-soluble organic solvent such as methanol or ethanol, or a surfactant to the aqueous solution of the alkali can be used as the developing solution.

The developing time may vary depending on the constituent of the photoresist composition according to the present invention, the film thickness of the photoresist layer, and the like. Usually, the developing time is 1 to 30 min. The method of the development may be any one of a liquid-filling method, a dipping method, a paddle method, a spray developing method, and the like.

After development, the photoresist laminate is subjected to washing with flowing water for 30 seconds to 90 seconds, and is dried by using an air gun, an oven, or the like. In this manner, a photoresist pattern can be produced.

Method for Producing Connecting Terminal

Connecting terminals such as bumps or metal posts can be formed by embedding a conductor such as a metal, by means of plating or the like, in a nonresist section (an area that has been removed by a developing liquid) of the photoresist pattern obtained as described above. Furthermore, there are no particular limitations on the plating-treatment method, and various methods that are conventionally known can be employed. Regarding the plating liquid, liquids for solder plating, copper plating, gold plating, and nickel plating in particular are suitably used. Finally, any residual thick-film photoresist pattern is removed by using a stripping liquid or the like according to a standard method.

EXAMPLES

Examples of the present invention are described below; however, the scope of the invention is not intended to be limited by these examples.

Examples 1 to 53 and Comparative Examples 1 to 4

50 parts by mass of a polymer having the structure shown below, 50 parts by mass of a novolac polymer (m-cresol:p-cresol=6:4), 2 parts by mass of an acid generator, and 0.1 parts by mass of tripentylamine were dissolved in propylene glycol monomethyl ether acetate to a solid concentration of 50% by mass, and thus a positive type resist composition was prepared. Meanwhile, the numerical values included in the respective repeating units in the structural formula of the polymer described below represent the proportions (mol %) of the respective repeating units relative to the mole number of all the repeating units contained in the polymer.

(Polymer)

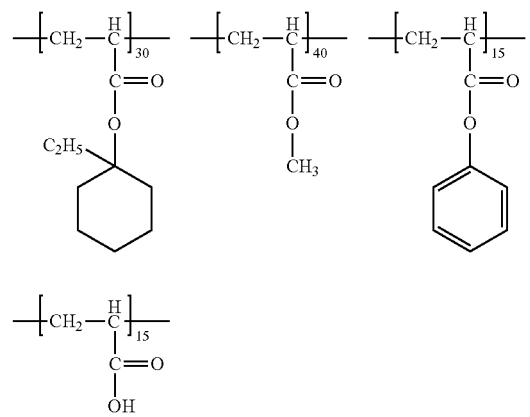

A compound having the structure described below was used as the acid generator.

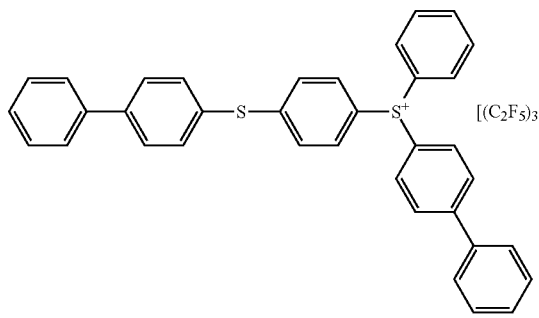 [(C₂F₅)₃PF₃]⁻

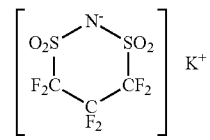 K⁺ (xv)

Each of the positive-type resist compositions of the Examples and Comparative Examples was applied on a copper substrate having a diameter of 8 inches, and thus a photoresist layer having a film thickness of 50 μm was formed. Subsequently, the photoresist layer was prebaked for 5 minutes at 140° C. After prebaking, the photoresist layer was subjected to patternwise exposure to line ghi at the exposure dose indicated in Table 1, by using a mask with a hole pattern having a width of 60 μm and a Prisma GHI5452 exposing apparatus (manufactured by Ultratech, Inc.). Subsequently, the substrate was placed on a hot plate and exposed for 3 minutes at 85° C., and then heating (PEB) was carried out. Thereafter, the operation of dropping a 2.38 wt % aqueous solution of tetramethylammonium hydroxide (NMD-3 developing liquid, manufactured by Tokyo Ohka Kogyo Co., Ltd.) onto the exposed photoresist layer and then leaving the photoresist layer to stand for 60 seconds at 23° C. was repeated 4 times in total. Thereafter, the resist pattern surface was washed with flowing water, and then was subjected to nitrogen blowing. A resist pattern was obtained in this manner. The cross-sectional shape of this resist pattern was observed with a scanning electron microscope, and the difference between the width of the top (the surface side of the resist layer) and the width of the bottom (the copper substrate surface side) in the nonresist section was determined. The difference between the width of the bottom and the width of the top in the nonresist section is described in Table 1.

To the positive-type resist compositions obtained in the various Examples and Comparative Examples, alkali-metal salts of the kinds described in Table 1 were added at the ratios (ppm by mass) indicated in Table 1 relative to the mass of the acid generator. Meanwhile, in Comparative Examples 1 to 4, no alkali-metal salt was added to the positive-type resist compositions.

Regarding the alkali-metal salt, (i) Na(C₆F₅)₄B, (ii) K(C₆F₅)₄B, (iii) K(C₂F₅)₃PF₃, (iv) Li(C₆F₅)₄B, (v) K(CF₃)SO₃, (vi) Li(CF₃)SO₃, (vii) K(C₄F₉)SO₃, (viii) Li(C₄F₉)SO₃, and alkali-metal salts having the following formulae (ix) to (xv) were used.

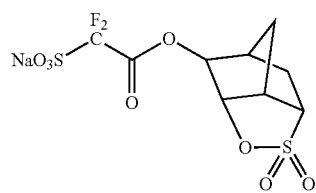 (ix)

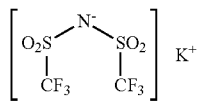 (x)

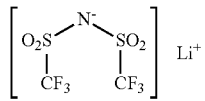 (xi)

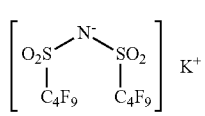 (xii)

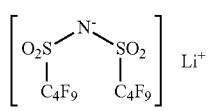 (xiii)

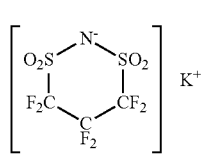 (xiv)

TABLE 1

| | Alkali-metal salt | | Exposure dose (mJ/cm²) | Difference between the width of the top and the width of the bottom (width of the bottom − width of the top) (μm) |
|---|---|---|---|---|
| | Type | Ratio (ppm by mass) | | |
| Ex. 1 | i | 2000 | 450 | 3.2 |
| Ex. 2 | i | 4000 | 450 | 8.7 |
| Ex. 3 | i | 8000 | 450 | 17.5 |
| Ex. 4 | i | 2000 | 600 | 7.8 |
| Ex. 5 | i | 4000 | 600 | 9.9 |
| Ex. 6 | i | 8000 | 600 | 15.5 |
| Ex. 7 | i | 2000 | 900 | 15.9 |
| Ex. 8 | i | 4000 | 900 | 13.9 |
| Ex. 9 | i | 8000 | 900 | 23.9 |
| Ex. 10 | ii | 2000 | 450 | 0.4 |
| Ex. 11 | ii | 4000 | 450 | 1.6 |
| Ex. 12 | ii | 8000 | 450 | 2.0 |
| Ex. 13 | ii | 2000 | 600 | 2.0 |
| Ex. 14 | ii | 4000 | 600 | 2.8 |
| Ex. 15 | ii | 8000 | 600 | 2.8 |
| Ex. 16 | ii | 2000 | 900 | 3.2 |
| Ex. 17 | ii | 4000 | 900 | 3.9 |
| Ex. 18 | ii | 8000 | 900 | 6.5 |
| Ex. 19 | iii | 2000 | 450 | 0.2 |
| Ex. 20 | iii | 4000 | 450 | 0.8 |
| Ex. 21 | iii | 8000 | 450 | 1.0 |
| Ex. 22 | iv | 1000 | 350 | 20.7 |
| Ex. 23 | iv | 1000 | 450 | 25.5 |
| Ex. 24 | iv | 1000 | 600 | 30.3 |
| Ex. 25 | iv | 2000 | 350 | 74.9 |
| Ex. 26 | v | 2000 | 450 | 3.2 |

TABLE 1-continued

| | Alkali-metal salt | | Exposure dose (mJ/cm$^2$) | Difference between the width of the top and the width of the bottom (width of the bottom − width of the top) (μm) |
|---|---|---|---|---|
| | Type | Ratio (ppm by mass) | | |
| Ex. 27 | v | 8000 | 450 | 3.6 |
| Ex. 28 | v | 2000 | 600 | 3.2 |
| Ex. 29 | v | 8000 | 600 | 9.1 |
| Ex. 30 | v | 2000 | 900 | 4.3 |
| Ex. 31 | v | 8000 | 900 | 9.1 |
| Ex. 32 | v | 100000 | 450 | 4.3 |
| Ex. 33 | vi | 50000 | 350 | 80.2 |
| Ex. 34 | vii | 2000 | 450 | 1.6 |
| Ex. 35 | vii | 8000 | 450 | 2.4 |
| Ex. 36 | vii | 2000 | 600 | 1.6 |
| Ex. 37 | vii | 8000 | 600 | 3.6 |
| Ex. 38 | vii | 2000 | 900 | 4.3 |
| Ex. 39 | vii | 8000 | 900 | 5.9 |
| Ex. 40 | vii | 100000 | 450 | 4.1 |
| Ex. 41 | viii | 50000 | 350 | 80.2 |
| Ex. 42 | ix | 2000 | 450 | 4.0 |
| Ex. 43 | ix | 8000 | 450 | 9.5 |
| Ex. 44 | ix | 2000 | 600 | 8.7 |
| Ex. 45 | ix | 8000 | 600 | 14.3 |
| Ex. 46 | ix | 2000 | 900 | 9.1 |
| Ex. 47 | ix | 8000 | 900 | 9.9 |
| Ex. 48 | x | 100000 | 450 | 4.5 |
| Ex. 49 | xi | 50000 | 350 | 83.1 |
| Ex. 50 | xii | 100000 | 450 | 4.2 |
| Ex. 51 | xiii | 50000 | 350 | 81.1 |
| Ex. 52 | xiv | 100000 | 450 | 4.2 |
| Ex. 53 | xv | 50000 | 350 | 80.2 |
| Comp. ex. 1 | — | — | 450 | −0.4 |
| Comp. ex. 2 | — | — | 600 | 0.4 |
| Comp. ex. 3 | — | — | 900 | 2.5 |
| Comp. ex. 4 | — | — | 350 | −0.5 |

According to Examples 1 to 53 and Comparative Examples 1 to 4, it is understood that when an alkali-metal salt is added to a positive-type photoresist composition that contains an acid generator capable of generating an acid when irradiated with an active ray or radiation, a resin whose solubility in alkali increases under the action of acid, and an organic solvent, a photoresist pattern having a nonresist section in which the width of the bottom (the support surface side) is larger than the width of the top (the surface side of the photoresist layer) can be formed.

What is claimed is:

1. A positive photoresist composition comprising an acid generator (A) capable of generating an acid when irradiated with an active ray or radiation, a resin (B) whose solubility in alkali increases under the action of acid, an alkali-metal salt (C), and an organic solvent (S), wherein the alkali-metal salt (C) is represented by the following formula (C1):

(W$^+$)$_n$X$^{n-}$   (C1)

wherein in formula (C1), W$^+$ represents an alkali-metal ion; X$^{n-}$ represents a monovalent counteranion; and n represents 1, wherein the monovalent counteranion is selected from the group consisting of anions represented by the following formulae (C2) to (C14):

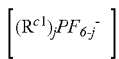   (C2)

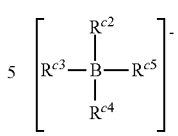   (C3)

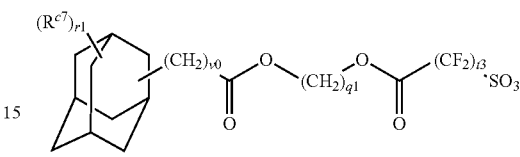   (C4)

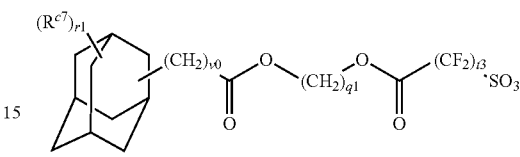   (C5)

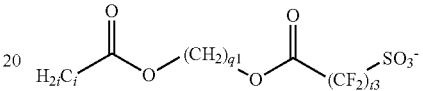   (C6)

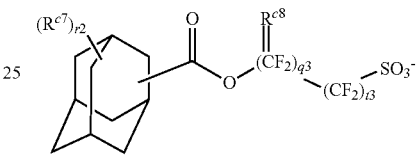   (C7)

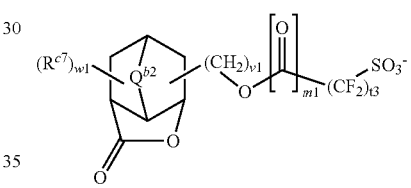   (C8)

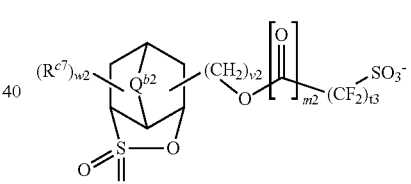   (C9)

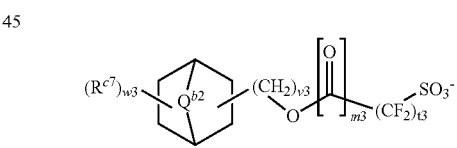   (C10)

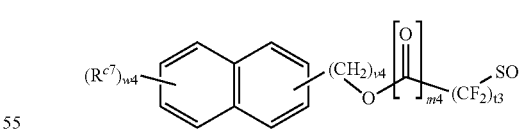   (C11)

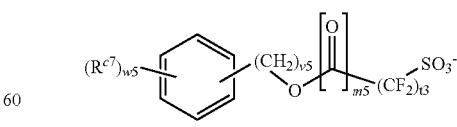   (C12)

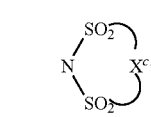   (C13)

-continued

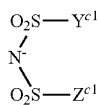
(C14)

wherein in formula (C2), $R^{c1}$ represents an alkyl group in which 80% or more of the hydrogen atoms are substituted by fluorine atoms; j represents the number of $R^{c1}$s and represents an integer from 1 to 5; and the $R^{c1}$s in the number of j may be respectively identical to or different from each other;
in formula (C3), $R^{c2}$ to $R^{c5}$ each independently represents a fluorine atom or a phenyl group; and
some or all of the hydrogen atoms of the phenyl group may be substituted by at least one selected from the group consisting of a fluorine atom and a trifluoromethyl group;
in formula (C4), $R^{c6}$ represents a group represented by the following formula (C4-1), (C4-2), or (C4-3);

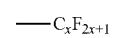
(C4-1)

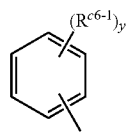
(C4-2)

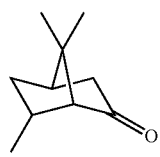
(C4-3)

in formula (C4-1), x represents an integer from 1 to 4;
in formula (C4-2), $R^{c6-1}$ represents a hydrogen atom, a hydroxyl group, a linear or branched alkyl group having 1 to 6 carbon atoms, or a linear or branched alkoxy group having 1 to 6 carbon atoms; and y represents an integer from 1 to 3;
in formulae (C5) to (C7), v0 represents an integer from 0 to 3; q1 and q2 each independently represents an integer from 1 to 5; q3 represents an integer from 1 to 12; r1 and r2 each independently represents an integer from 0 to 3; i represents an integer from 1 to 20; t3 represents an integer from 1 to 3; $R^{c7}$ represents a substituent; and $R^{c8}$ represents a hydrogen atom, an alkyl group or a halogenated alkyl group having 1 to 5 carbon atoms;
in formulae (C8) to (C12), t3 and $R^{c7}$ have the same definitions as t3 and $R^{c7}$ in formulae (C5) to (C7), respectively; $Q^{b2}$ represents an alkylene group which may contain an oxygen atom or a sulfur atom, an oxygen atom or a sulfur atom; m1 to m5 each independently represents 0 or 1; v1 to v5 each independently represents an integer from 0 to 3; and w1 to w5 each independently represents an integer from 0 to 3; and
in formulae (C13) and (C14) $X^{c1}$ represents an alkylene group having 2 to 6 carbon atoms in which at least 1 hydrogen atom is substituted by a fluorine atom; and $Y^{c1}$ and $Z^{c1}$ each independently represent an alkyl group having 1 to 10 carbon atoms in which at least 1 hydrogen atom is substituted by a fluorine atom.

2. The positive photoresist composition according to claim 1, wherein the content of the alkali-metal salt (C) is 1,000 ppm to 100,000 ppm by mass relative to the mass of the acid generator (A).

3. The positive photoresist composition according to claim 1, further comprising an alkali-soluble resin (D).

4. The positive photoresist composition according to claim 3, wherein the alkali-soluble resin (D) includes at least one resin selected from the group consisting of a novolac resin (D1), a polyhydroxystyrene resin (D2), and an acrylic resin (D3).

5. The positive photoresist composition according to claim 1, further comprising an acid-diffusion control agent (E).

6. A photoresist laminate comprising a support, and laminated thereon a photoresist layer consisting of the positive photoresist composition according to claim 1.

7. A method for producing a photoresist pattern, the method comprising:
laminating on a support, a photoresist layer formed from the positive photoresist composition according to claim 1;
exposing the photoresist layer with an active ray or radiation; and
developing the photoresist layer after exposure, and thereby obtaining the photoresist pattern.

8. A method for producing a connecting terminal, the method comprising forming a connecting terminal formed of a conductor, in a nonresist section of the photoresist pattern obtainable by the method for producing the photoresist pattern according to claim 7.

* * * * *

UNITED STATES PATENT AND TRADEMARK OFFICE
CERTIFICATE OF CORRECTION

PATENT NO. : 9,091,916 B2
APPLICATION NO. : 13/774891
DATED : July 28, 2015
INVENTOR(S) : Shimizu et al.

It is certified that error appears in the above-identified patent and that said Letters Patent is hereby corrected as shown below:

In the specification

Col. 5, line 18, "sulfonio]phenyl}sulfide," should read --sulfonio}phenyl]sulfide,--.

Col. 39, line 15, "[(CF$_3$CF$_2$CF$_2$)$_3$PF$_3$]." should read --[(CF$_3$CF$_2$CF$_2$)$_3$PF$_3$]$^-$.--.

Col. 48, line 22, "N,N-dimethlyacetamide," should read --N,N-dimethylacetamide,--.

In the claims

Col. 54, lines 63-67, Claim 1:

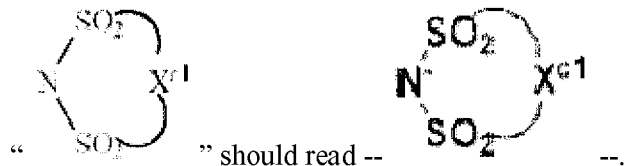 should read -- --.

Signed and Sealed this
Third Day of May, 2016

Michelle K. Lee
*Director of the United States Patent and Trademark Office*